US012368122B2

(12) United States Patent
Hong et al.

(10) Patent No.: US 12,368,122 B2
(45) Date of Patent: Jul. 22, 2025

(54) SEMICONDUCTOR PACKAGE

(71) Applicant: SAMSUNG ELECTRONICS CO., LTD., Suwon-si (KR)

(72) Inventors: Jinhee Hong, Hwaseong-si (KR); Jinmo Kwon, Yongin-si (KR)

(73) Assignee: Samsung Electronics Co., Ltd., Suwon-Si (KR)

(*) Notice: Subject to any disclaimer, the term of this patent is extended or adjusted under 35 U.S.C. 154(b) by 492 days.

(21) Appl. No.: 17/895,223

(22) Filed: Aug. 25, 2022

(65) Prior Publication Data
US 2023/0215829 A1 Jul. 6, 2023

(30) Foreign Application Priority Data
Jan. 6, 2022 (KR) .................. 10-2022-0002261

(51) Int. Cl.
H01L 23/00 (2006.01)
H01L 23/498 (2006.01)
H01L 25/065 (2023.01)

(52) U.S. Cl.
CPC ........ H01L 24/09 (2013.01); H01L 23/49816 (2013.01); H01L 23/49838 (2013.01); H01L 24/32 (2013.01); H01L 24/48 (2013.01); H01L 24/73 (2013.01); H01L 25/0657 (2013.01); H01L 2224/09133 (2013.01); H01L 2224/09179 (2013.01); H01L 2224/32145 (2013.01); H01L 2224/32225 (2013.01); H01L 2224/48227 (2013.01); H01L 2224/73215 (2013.01); H01L 2224/73265 (2013.01); H01L 2225/0651 (2013.01); H01L 2225/06524 (2013.01);
(Continued)

(58) Field of Classification Search
CPC ............... H01L 24/09; H01L 23/49816; H01L 23/49838; H01L 24/32
See application file for complete search history.

(56) References Cited

U.S. PATENT DOCUMENTS 8,232,631 B2 * 7/2012 Cho .................... H01L 25/0657
257/E23.173
8,304,918 B2 * 11/2012 Tsukano .............. H01L 23/3135
438/109
(Continued)

FOREIGN PATENT DOCUMENTS

CN 101236959 A * 8/2008
CN 110797321 A * 2/2020 ............. H01L 23/16
(Continued)

Primary Examiner — Laura M Menz
(74) Attorney, Agent, or Firm — Fish & Richardson P.C.

(57) ABSTRACT

A semiconductor package includes a lower semiconductor chip, a first upper semiconductor chip including upper pads, and bonding wires coupled to the substrate and the upper pads. The first upper semiconductor chip has a first overhang region adjacent to a first lateral surface of the first upper semiconductor chip, a second overhang region adjacent to a second lateral surface of the first upper semiconductor chip, and a first corner overhang region adjacent to a corner where the first and second lateral surfaces meet with each other. The upper pads include first upper pads on the first overhang region and second upper pads on the second overhang region. The number of the first upper pads is less than that of the second upper pads. The upper pads are spaced apart from the first corner overhang region.

13 Claims, 20 Drawing Sheets

(52) U.S. Cl.
CPC ............... *H01L 2225/06562* (2013.01); *H01L 2924/1431* (2013.01); *H01L 2924/1436* (2013.01); *H01L 2924/3512* (2013.01)

(56) References Cited

U.S. PATENT DOCUMENTS

| | | | | |
|---|---|---|---|---|
| 8,390,114 | B2* | 3/2013 | Kim | H01L 24/16 |
| | | | | 257/725 |
| 8,415,808 | B2* | 4/2013 | Liao | H01L 25/0657 |
| | | | | 257/777 |
| 8,536,690 | B2* | 9/2013 | Camacho | H01L 23/4334 |
| | | | | 257/676 |
| 8,552,546 | B2* | 10/2013 | Song | H01L 25/0657 |
| | | | | 257/777 |
| 8,659,137 | B2* | 2/2014 | Omizo | H01L 21/6835 |
| | | | | 257/723 |
| 8,659,175 | B2* | 2/2014 | Ju | H01L 25/0657 |
| | | | | 257/784 |
| 9,093,441 | B2* | 7/2015 | Kim | H01L 23/49827 |
| 9,117,741 | B2* | 8/2015 | Fujii | H01L 25/0657 |
| 9,129,846 | B2* | 9/2015 | Song | H01L 25/50 |
| 9,177,863 | B2* | 11/2015 | Gillingham | H01L 25/50 |
| 9,293,443 | B2* | 3/2016 | Nam | H01L 24/32 |
| 9,646,942 | B2* | 5/2017 | Lin | H01L 24/83 |
| 9,691,691 | B2* | 6/2017 | Kim | H01L 24/73 |
| 10,510,715 | B2* | 12/2019 | Yu | H01L 25/0657 |
| 11,177,238 | B2* | 11/2021 | Yu | H01L 25/0652 |
| 11,842,983 | B2* | 12/2023 | Yu | H01L 25/50 |
| 11,848,308 | B2* | 12/2023 | Park | H01L 25/0657 |
| 2005/0067694 | A1* | 3/2005 | Pon | H01L 25/0657 |
| | | | | 257/723 |
| 2005/0236705 | A1* | 10/2005 | Lim | H01L 24/78 |
| | | | | 257/E25.013 |
| 2007/0241453 | A1* | 10/2007 | Ha | H01L 25/03 |
| | | | | 257/723 |
| 2009/0045496 | A1* | 2/2009 | Tian | H01L 23/16 |
| | | | | 257/E21.598 |
| 2009/0057916 | A1* | 3/2009 | Yeom | H01L 25/0657 |
| | | | | 257/E23.024 |
| 2011/0068449 | A1* | 3/2011 | Kook | H01L 25/50 |
| | | | | 257/784 |
| 2012/0007236 | A1* | 1/2012 | Bae | H01L 23/498 |
| | | | | 257/737 |
| 2012/0267772 | A1* | 10/2012 | Fujisawa | H01L 23/02 |
| | | | | 257/676 |
| 2014/0175638 | A1* | 6/2014 | Kim | H01L 25/0756 |
| | | | | 257/737 |
| 2014/0175673 | A1* | 6/2014 | Kim | H01L 24/06 |
| | | | | 257/777 |
| 2015/0102506 | A1* | 4/2015 | Song | H01L 24/05 |
| | | | | 257/777 |
| 2015/0115468 | A1* | 4/2015 | Chun | H01L 25/0657 |
| | | | | 361/783 |
| 2015/0194410 | A1* | 7/2015 | Nam | H01L 24/32 |
| | | | | 257/701 |
| 2015/0255381 | A1* | 9/2015 | Kim | H01L 24/73 |
| | | | | 257/676 |
| 2016/0013158 | A1* | 1/2016 | Kang | H01L 23/13 |
| | | | | 257/777 |
| 2017/0170145 | A1* | 6/2017 | Yu | H01L 25/0652 |
| 2020/0111763 | A1* | 4/2020 | Hong | H01L 24/08 |
| 2020/0118974 | A1* | 4/2020 | Yu | H01L 25/50 |
| 2022/0068880 | A1* | 3/2022 | Yu | H01L 25/50 |
| 2022/0406746 | A1* | 12/2022 | Jeon | H01L 24/48 |
| 2023/0028252 | A1* | 1/2023 | Jung | H01L 24/49 |
| 2023/0098993 | A1* | 3/2023 | Oh | H01L 24/48 |
| | | | | 257/686 |
| 2023/0215829 | A1* | 7/2023 | Hong | H01L 24/32 |
| | | | | 257/678 |
| 2023/0317657 | A1* | 10/2023 | Seo | H01L 25/0657 |
| 2023/0395568 | A1* | 12/2023 | Kim | H01L 24/48 |
| 2024/0014144 | A1* | 1/2024 | Kim | H01L 23/544 |
| 2024/0021580 | A1* | 1/2024 | Ju | H01L 23/49816 |
| 2024/0038725 | A1* | 2/2024 | Ma | H01L 24/13 |
| 2024/0170456 | A1* | 5/2024 | Kyung | H01L 24/92 |
| 2024/0258278 | A1* | 8/2024 | Shin | H01L 24/08 |
| 2024/0274580 | A1* | 8/2024 | Che | H01L 25/0657 |
| 2025/0015052 | A1* | 1/2025 | Lee | H01L 24/49 |
| 2025/0054889 | A1* | 2/2025 | Hong | H01L 24/06 |

FOREIGN PATENT DOCUMENTS

| | | | | |
|---|---|---|---|---|
| CN | 116403987 | A | * 7/2023 | ........ H01L 23/49816 |
| CN | 116936526 | A | * 10/2023 | ............. H01L 24/08 |
| CN | 118507432 | A | * 8/2024 | ......... H01L 21/4803 |
| JP | 2004071997 | A | * 3/2004 | |
| JP | 2006216692 | A | * 8/2006 | ......... H01L 21/6836 |
| KR | 10-0585140 | B1 | 5/2006 | |
| KR | 10-0988722 | B1 | 10/2010 | |

* cited by examiner

SEMICONDUCTOR PACKAGE

CROSS-REFERENCE TO RELATED APPLICATION

This U.S. nonprovisional application claims priority under 35 U.S.C § 119 to Korean Patent Application No. 10-2022-0002261 filed on Jan. 6, 2022, in the Korean Intellectual Property Office, the disclosure of which is hereby incorporated by reference in its entirety.

BACKGROUND

The present disclosure relates to a semiconductor package and, more particularly, to a semiconductor package including a bonding wire.

A semiconductor package is provided to implement an integrated circuit chip for use in electronic products. A semiconductor package is typically configured such that a semiconductor chip is mounted on a printed circuit board and bonding wires or bumps are used to electrically connect the semiconductor chip to the printed circuit board.

SUMMARY

Some embodiments of the present disclosure provide a semiconductor package with increased reliability and improved electrical properties.

According to some embodiments of the present disclosure, a semiconductor package may comprise: a substrate; a lower semiconductor chip on the substrate; a first upper semiconductor chip on a top surface of the lower semiconductor chip and including a plurality of upper pads; and a plurality of bonding wires coupled to the substrate and the upper pads. When viewed in a plan view, the first upper semiconductor chip may have: a first overhang region spaced apart from the lower semiconductor chip and adjacent to a first lateral surface of the first upper semiconductor chip; a second overhang region spaced apart from the lower semiconductor chip and adjacent to a second lateral surface of the first upper semiconductor chip; and a first corner overhang region spaced apart from the lower semiconductor chip and adjacent to a corner where the first lateral surface of the first upper semiconductor chip meets the second lateral surface of the first upper semiconductor chip. The upper pads may include: a plurality of first upper pads on a top surface of the first overhang region; and a plurality of second upper pads on a top surface of the second overhang region. The number of the first upper pads may be less than the number of the second upper pads. The upper pads may be spaced apart from the first corner overhang region of the first upper semiconductor chip.

According to some embodiments of the present disclosure, a semiconductor package may comprise: a substrate that includes a plurality of first substrate pads and a plurality of second substrate pads; a lower semiconductor chip on the substrate and including a plurality of lower pads; a first upper semiconductor chip on the lower semiconductor chip and including a plurality of upper pads; a plurality of first bonding wires coupled to the lower pads and the first substrate pads; a plurality of second bonding wires coupled to the upper pads and the second substrate pads; and a molding layer on a top surface of the substrate and covering the lower semiconductor chip, the first upper semiconductor chip, the first bonding wires, and the second bonding wires. The first upper semiconductor chip may be spaced apart from the lower pads. When viewed in a plan view, the first upper semiconductor chip may have: a first mounting region that overlaps the lower semiconductor chip; a first overhang region spaced apart from the lower semiconductor chip and between a first lateral surface of the lower semiconductor chip and a first lateral surface of the first upper semiconductor chip; a second overhang region spaced apart from the lower semiconductor chip and between a second lateral surface of the lower semiconductor chip and a second lateral surface of the first upper semiconductor chip; and a first corner overhang region spaced apart from the lower semiconductor chip and adjacent to a corner where the first lateral surface of the first upper semiconductor chip meets the second lateral surface of the first upper semiconductor chip. The upper pads may include: a plurality of first upper pads on a top surface of the first overhang region; and a plurality of second upper pads on a top surface of the second overhang region. The number of the second upper pads may be less than the number of the first upper pads. The upper pads may not be on the first corner overhang region of the first upper semiconductor chip.

According to some embodiments of the present disclosure, a semiconductor package may comprise: a substrate; a first semiconductor chip on the substrate and having a first lateral surface, a second lateral surface opposite to the first lateral surface, a third lateral surface, and a fourth lateral surface opposite to the third lateral surface, the first semiconductor chip including a plurality of first chip pads on a top surface of the first semiconductor chip; a second semiconductor chip on the first semiconductor chip and having a first sidewall, a second sidewall opposite to the first sidewall, a third sidewall, and fourth sidewall opposite to the third sidewall, the second semiconductor chip including a plurality of second chip pads on a top surface of the second semiconductor chip; a plurality of first bonding wires coupled to the first chip pads; and a plurality of second bonding wires coupled to the second chip pads. When viewed in a plan view, the first chip pads may be adjacent to the first lateral surface, the third lateral surface, and the fourth lateral surface of the first semiconductor chip. A maximum interval between the second chip pads and the second sidewall of the second semiconductor chip may be less than a minimum interval between the second chip pads and the second sidewall of the second semiconductor chip. The first sidewall of the second semiconductor chip may be vertically aligned with the first lateral surface of the first semiconductor chip.

DETAILED DESCRIPTION OF EMBODIMENTS

Figure 1A:
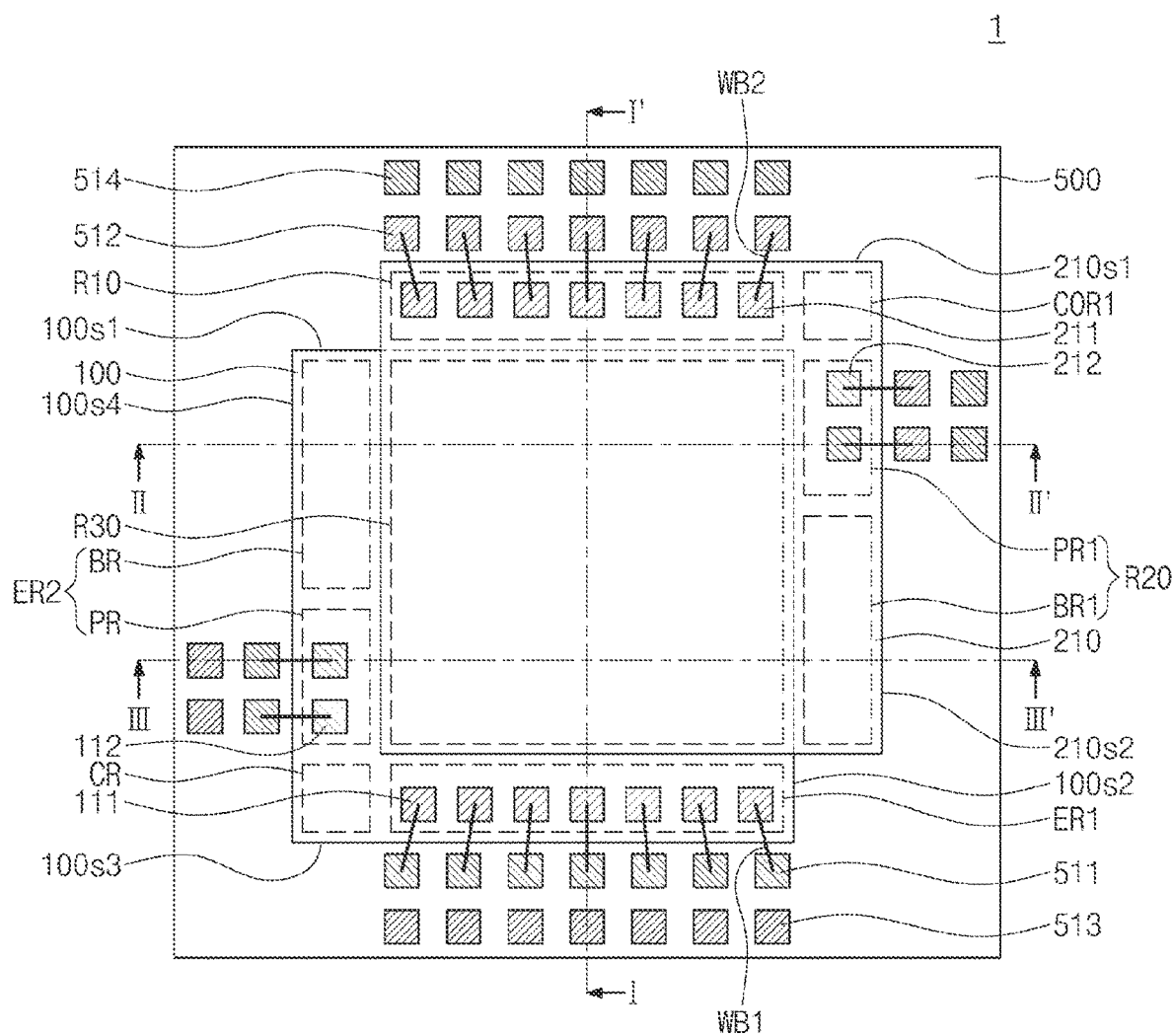
FIG. 1A illustrates a plan view showing a semiconductor package according to some embodiments.
Figure 1A:
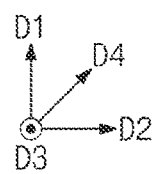

In this description, like reference numerals may indicate like components. The following will now describe semiconductor packages according to the present disclosure.

Figure 1B:
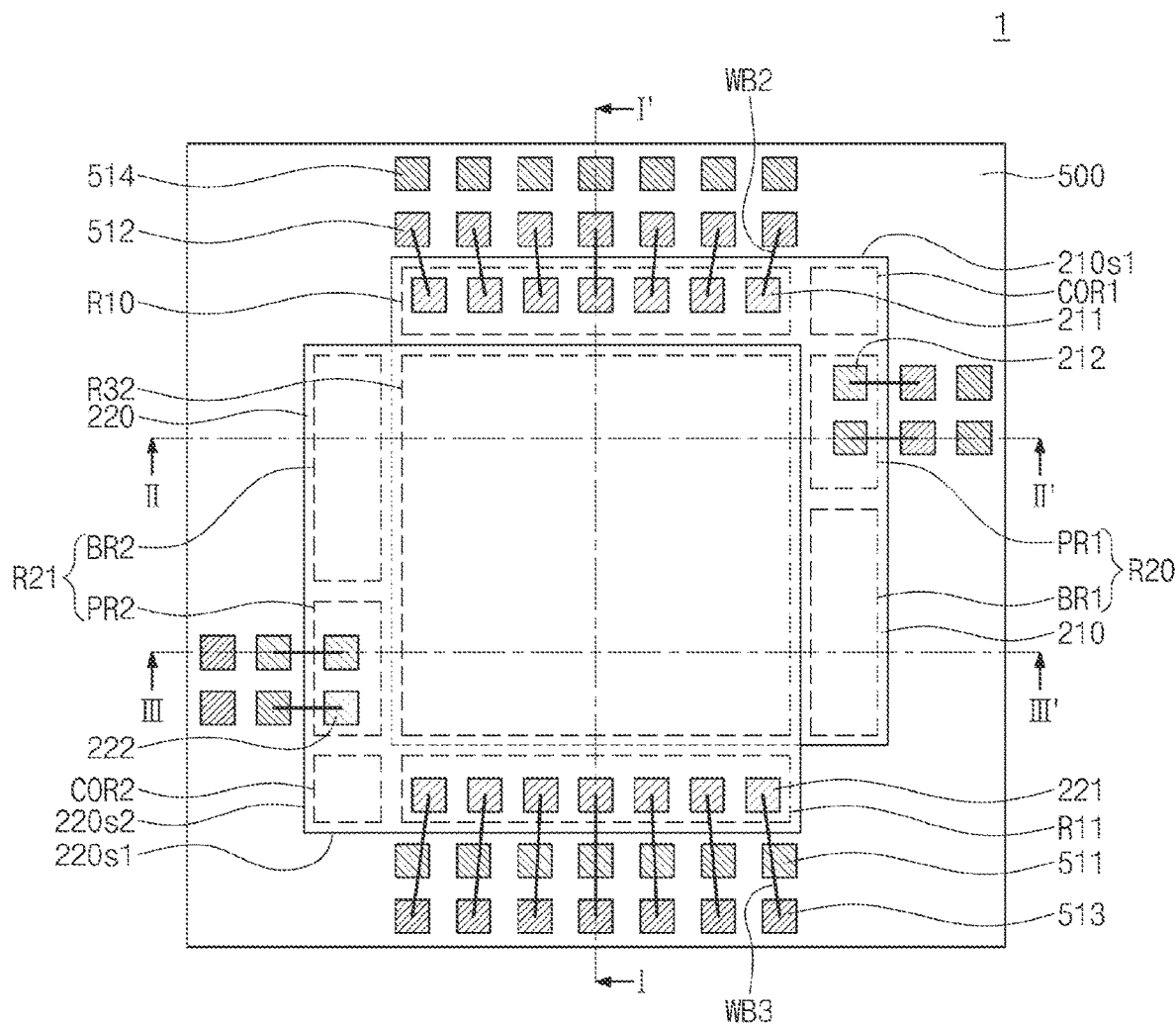
FIG. 1B illustrates a plan view showing an arrangement of first and second upper semiconductor chips in a semiconductor package according to some embodiments.
Figure 1C:
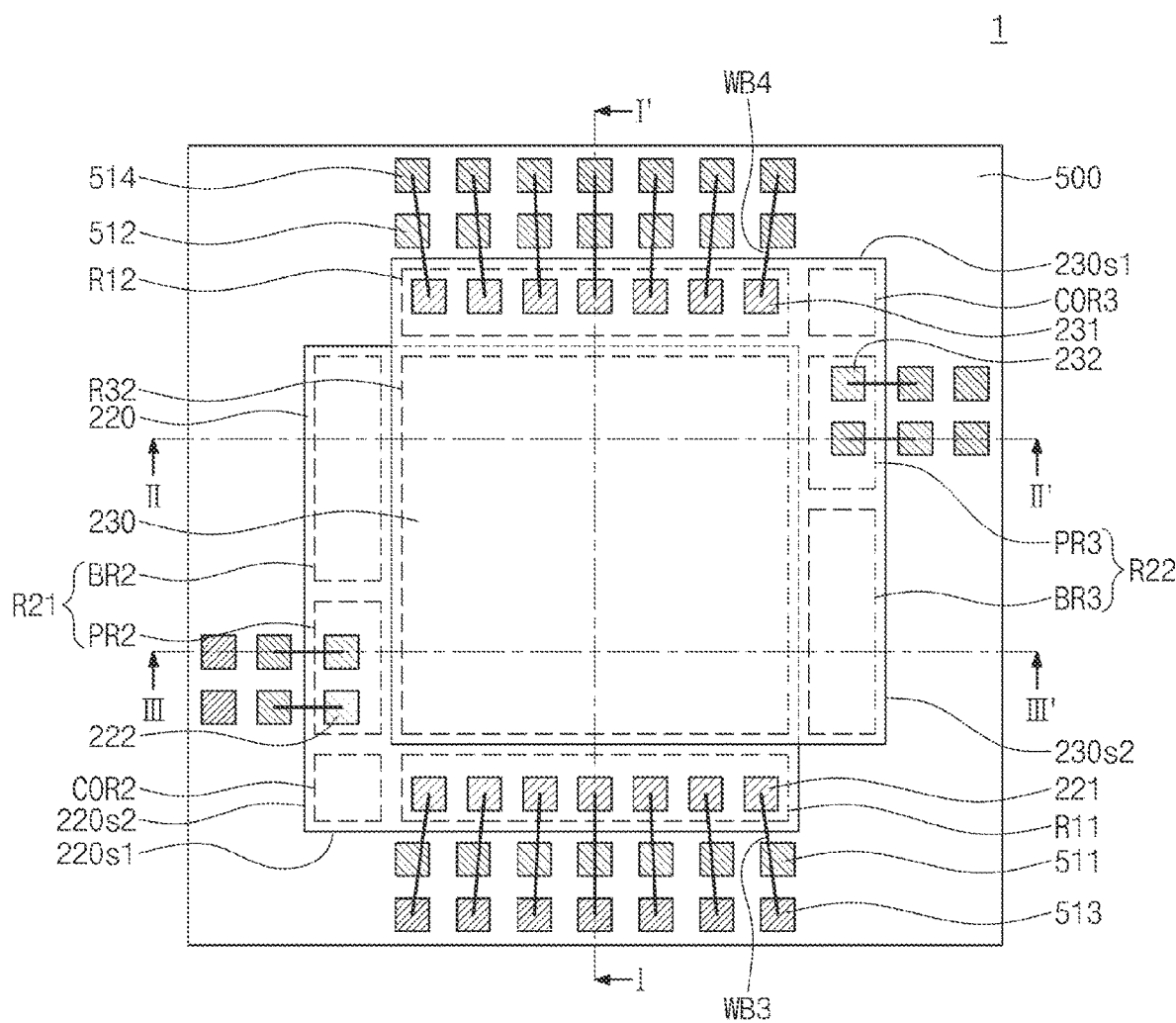
FIG. 1C illustrates a plan view showing an arrangement of second and third upper semiconductor chips in a semiconductor package according to some embodiments.
Figure 1C:
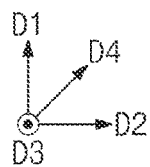
Figure 1D:
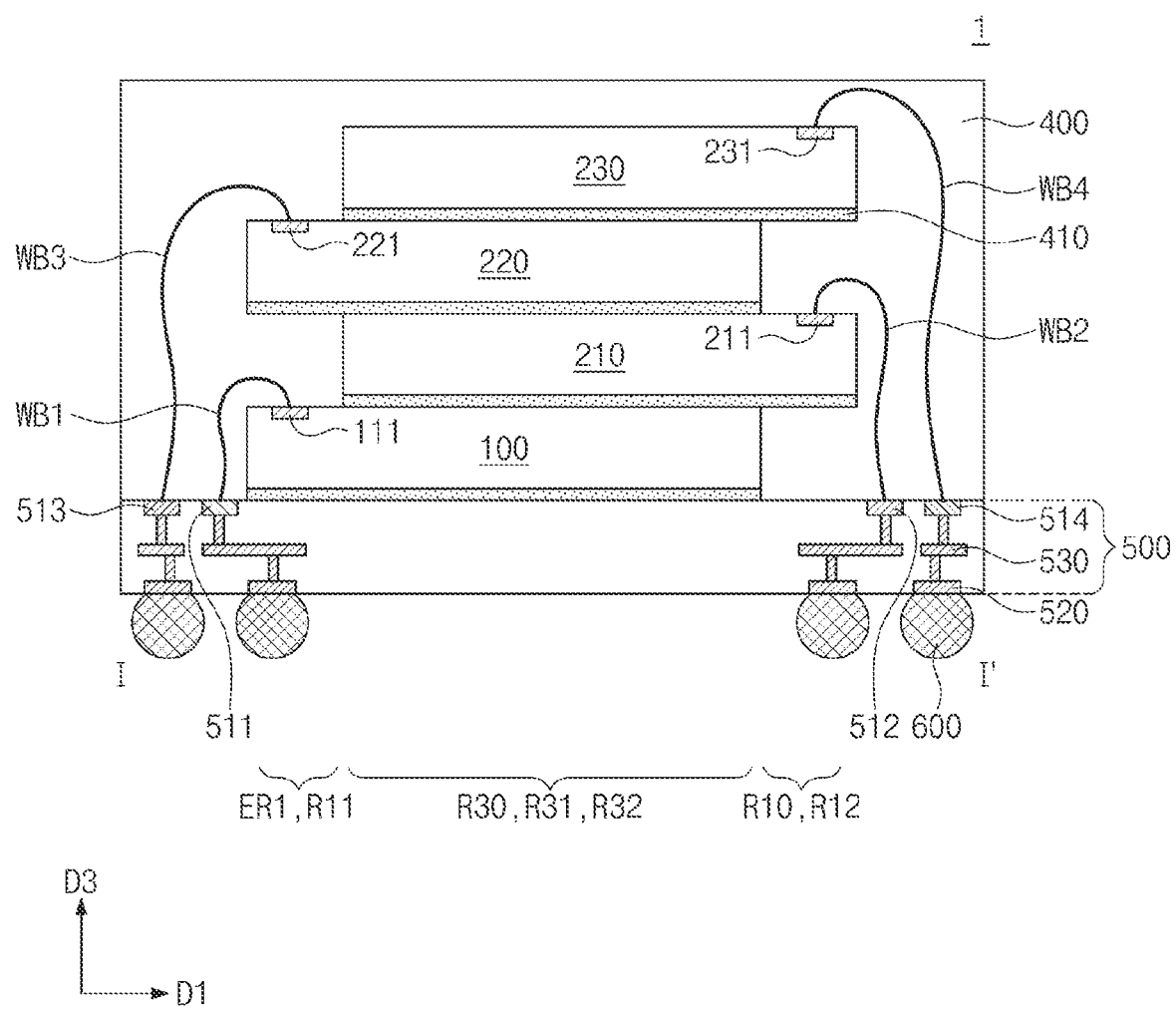
FIG. 1D illustrates a cross-sectional view taken along line I-I' of FIG. 1A.
Figure 1E:
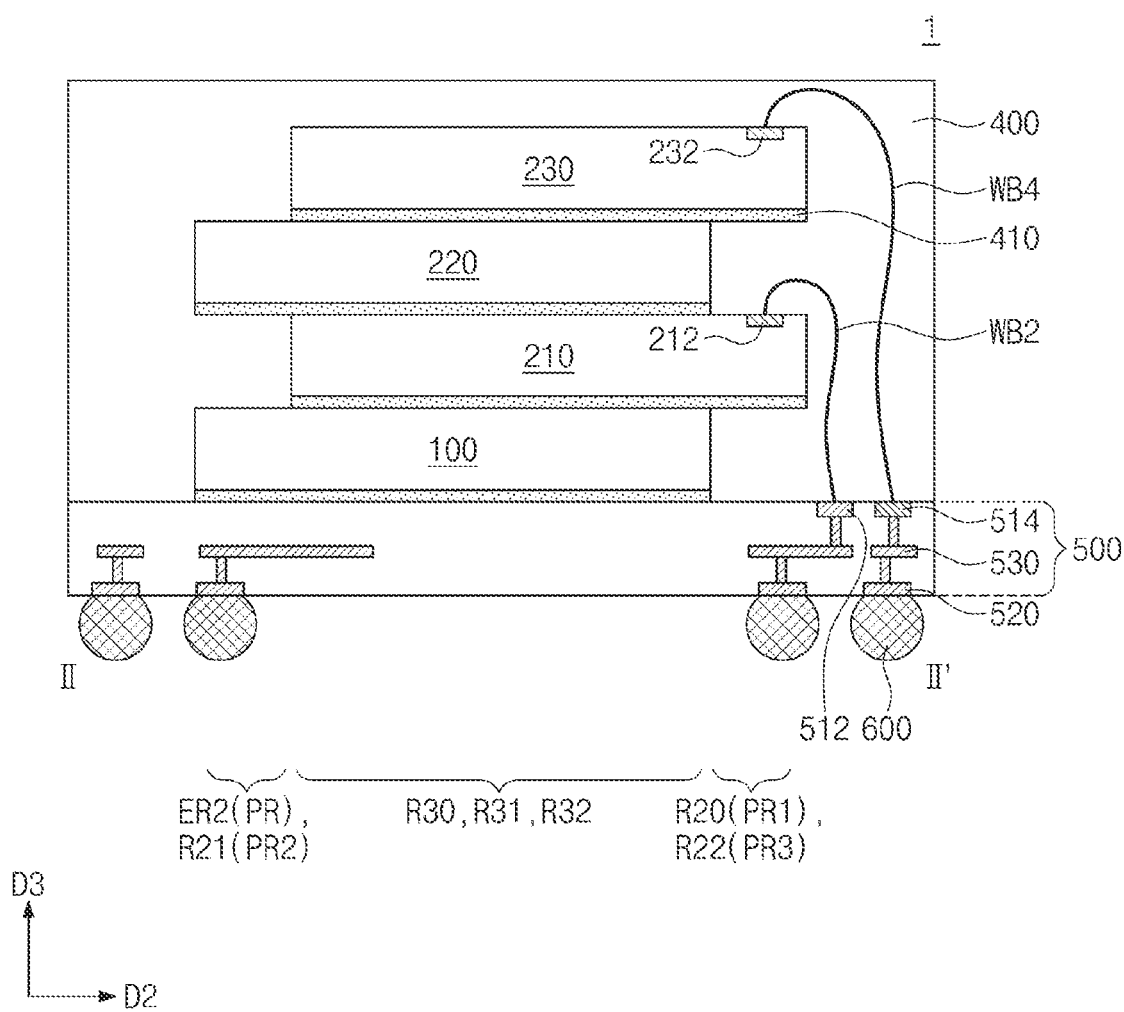
FIG. 1E illustrates a cross-sectional view taken along line II-II' of FIG. 1A.
Figure 1F:
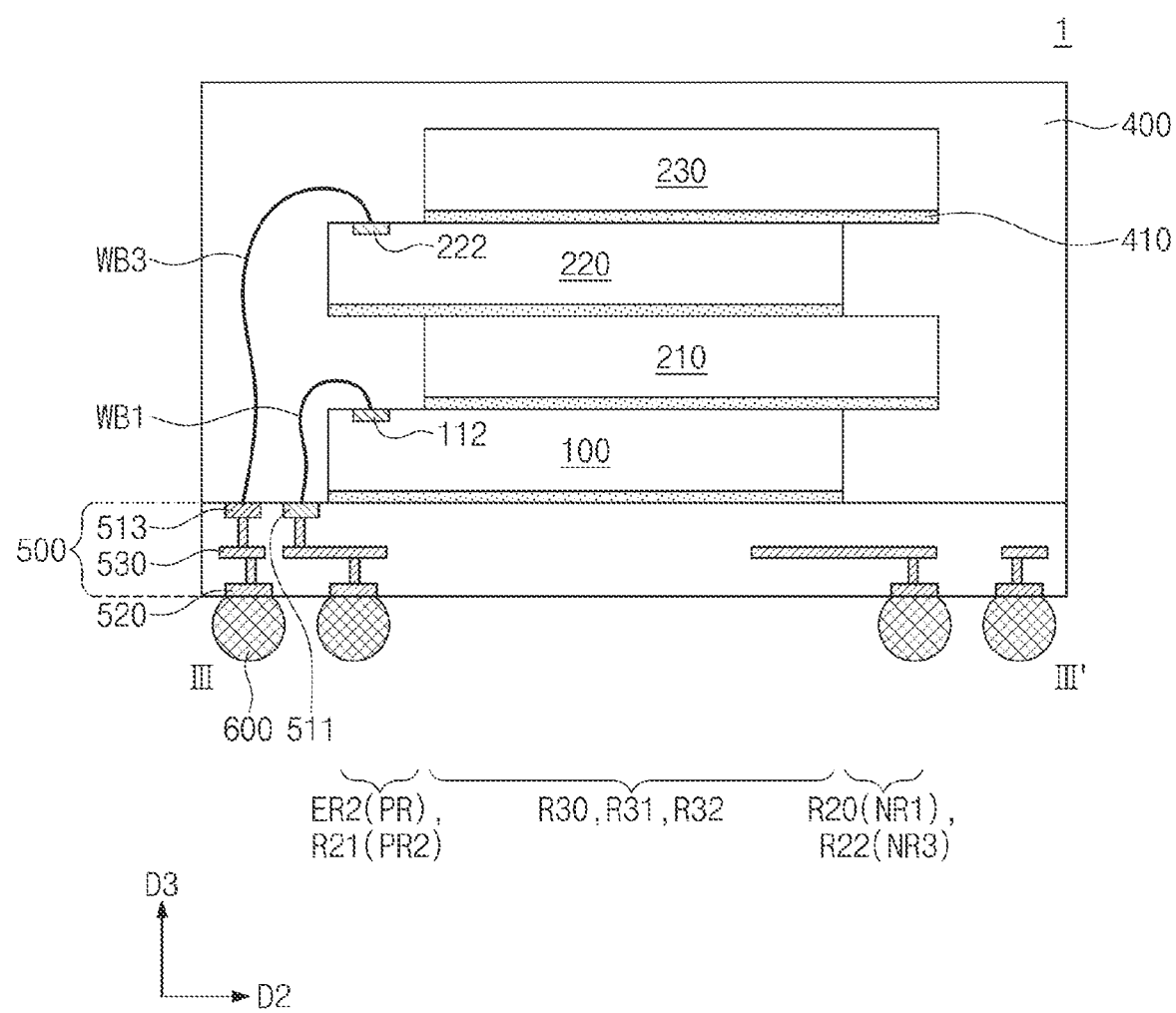
FIG. 1F illustrates a cross-sectional view taken along line III-III' of FIG. 1A.

FIG. 1A illustrates a plan view showing an arrangement of a lower semiconductor chip and a first upper semiconductor chip in a semiconductor package according to some embodiments. FIG. 1B illustrates a plan view showing an arrangement of first and second upper semiconductor chips in a semiconductor package according to some embodiments. FIG. 1C illustrates a plan view showing an arrangement of second and third upper semiconductor chips in a semiconductor package according to some embodiments. FIG. 1D illustrates a cross-sectional view taken along line I-I' of FIG. 1A. FIG. 1E illustrates a cross-sectional view taken along line II-II' of FIG. 1A. FIG. 1F illustrates a cross-sectional view taken along line III-III' of FIG. 1A. FIG. 1D corresponds to a cross section taken along line I-I' of FIG. 1B or 1C. FIG. 1E corresponds to a cross section taken along line II-II' of FIG. 1B or 1C. FIG. 1F corresponds to a cross section taken along line III-III' of FIG. 1B or 1C.

Referring to FIGS. 1A to 1F, a semiconductor package 1 may include a substrate 500, a lower semiconductor chip 100, a first upper semiconductor chip 210, first bonding wires WB1, and second bonding wires WB2.

The substrate 500 may include first substrate pads 511, second substrate pads 512, third substrate pads 513, fourth substrate pads 514, lower substrate pads 520, and conductive patterns 530. For example, the substrate 500 may be a printed circuit board (PCB). As illustrated in FIG. 1D, the substrate 500 may be provided on its top surface with the first substrate pads 511, the second substrate pads 512, and the third substrate pads 513. The first substrate pads 511, the second substrate pads 512, and the third substrate pads 513 may be disposed spaced apart from each other. The conductive patterns 530 may be provided in the substrate 500 and may be coupled to the first substrate pads 511, the second substrate pads 512, the third substrate pads 513, and/or the fourth substrate pads 514. The conductive patterns 530 may include vias and lines. The phrase "two components are electrically connected/coupled to each other" may mean that "the two components are directly connected to each other or indirectly connected to each other through other conductive component(s)." The expression "electrically connected to the substrate 500" may mean "electrically connected to one of the first, second, third, and fourth substrate pads 511, 512, 513, and 514." The lower substrate pads 520 may be provided on a bottom surface of the substrate 500. The lower substrate pads 520 may be electrically connected through the conductive patterns 530 to the first substrate pads 511, the second substrate pads 512, the third substrate pads 513, or the fourth substrate pads 514. The first to fourth substrate pads 511 to 514, the conductive patterns 530, and the lower substrate pads 520 may include one or more of aluminum, copper, tungsten, and titanium.

A first direction D1 may be parallel to the top surface of the substrate 500. A second direction D2 may be parallel to the top surface of the substrate 500 and substantially orthogonal to the first direction D1. A third direction D3 may be substantially perpendicular to the top surface of the substrate 500. A fourth direction D4 may be parallel to the top surface of the substrate 500 and may intersect the first and second directions D1 and D2. The fourth direction D4 may be a diagonal direction when viewed in a plan view.

The semiconductor package 1 may further include solder balls 600. The solder balls 600 may be provided on the bottom surface of the substrate 500. For example, the solder balls 600 may be coupled to bottom surfaces of the lower substrate pads 520. The solder balls 600 may include metal, such as a solder material. The solder material may include, for example, one or more of tin (Sn), silver (Ag), zinc (Zn), and any alloy thereof.

The lower semiconductor chip 100 may be disposed on the top surface of the substrate 500. The lower semiconductor chip 100 may include a memory chip, such as a dynamic random-access memory (DRAM). For another example, the lower semiconductor chip 100 may be a logic chip or a buffer chip.

As illustrated in FIG. 1A, the lower semiconductor chip 100 may have a first lateral surface 100s1, a second lateral surface 100s2, a third lateral surface 100s3, and a fourth lateral surface 100s4. The second lateral surface 100s2 may neighbor the first lateral surface 100s1 of the lower semiconductor chip 100. The third lateral surface 100s3 may stand opposite to the first lateral surface 100s1 of the lower semiconductor chip 100. The third lateral surface 100s3 of the lower semiconductor chip 100 may be parallel to the second direction D2. The fourth lateral surface 100s4 may stand opposite to the second lateral surface 100s2 of the lower semiconductor chip 100 and may neighbor the first and third lateral surfaces 100s1 and 100s3 of the lower semiconductor chip 100. The fourth lateral surface 100s4 of the lower semiconductor chip 100 may be parallel to the first direction D1.

When viewed in a plan view, the lower semiconductor chip 100 may have a first edge region ER1, a second edge region ER2, a mounting region, and a corner region CR. When viewed in a plan view, the first edge region ER1 of the lower semiconductor chip 100 may be adjacent to the third lateral surface 100s3 of the lower semiconductor chip 100. The second edge region ER2 of the lower semiconductor chip 100 may be adjacent to the fourth lateral surface 100s4 of the lower semiconductor chip 100. The corner region CR of the lower semiconductor chip 100 may be adjacent to a corner where the third lateral surface 100s3 and the fourth lateral surface 100s4 meet each other. The corner region CR of the lower semiconductor chip 100 may be provided between the third lateral surface 100s3 and the second edge region ER2 of the lower semiconductor chip 100 and between the fourth lateral surface 100s4 and the first edge region ER1 of the lower semiconductor chip 100.

The lower semiconductor chip 100 may include lower integrated circuits and a plurality of lower pads. The lower integrated circuits may be provided in the lower semiconductor chip 100. The lower pads may include first lower pads 111 and a second lower pad 112. The first lower pads 111 and the second lower pad 112 may be redistribution pads and/or chip pads of the lower semiconductor chip 100. The first lower pads 111 and the second lower pad 112 may be electrically connected to the lower integrated circuits.

The first lower pads 111 may be provided on a top surface at the first edge region ER1 of the lower semiconductor chip 100. The first lower pads 111 may be adjacent to the third lateral surface 100s3 of the lower semiconductor chip 100. The first lower pads 111 may be aligned along the second direction D2. The second lower pad 112 may be provided on a top surface at the second edge region ER2 of the lower semiconductor chip 100. The second lower pad 112 may be disposed adjacent to the fourth lateral surface 100s4 of the lower semiconductor chip 100. The second lower pad 112 may be provided in plural, and the plurality of second lower pads 112 may be aligned along the first direction D1. As the second lower pad 112 are provided, the first lower pads 111 may not be provided on the corner region CR of the lower semiconductor chip 100.

The number of the second lower pads 112 may be less than that of the first lower pads 111. For example, the number of the second lower pads 112 may be about 1% to about 50% of that of the first lower pads 111. The second lower pad 112 may have a size substantially the same as that of the first lower pad 111, but the present disclosure is not limited thereto. The first and second lower pads 111 and 112 may include one or more of aluminum, copper, nickel, and any alloy thereof. Differently from that shown, the lower semiconductor chip 100 may include a single second lower pad 112. The following will describe a plurality of second lower pads 112 in the interest of convenience, but the present disclosure is not limited thereto.

The second edge region ER2 of the lower semiconductor chip 100 may include a pad region PR and a blank region BR. When viewed in a plan view, the blank region BR of the lower semiconductor chip 100 may be adjacent to the first lateral surface 100s1 of the lower semiconductor chip 100. For example, the blank region BR of the lower semiconductor chip 100 may be provided between a first imaginary line and the first lateral surface 100s1 of the lower semiconductor chip 100. The first imaginary line may be parallel to the second direction D2 while passing through a midpoint of the fourth lateral surface 100s4 of the lower semiconductor chip 100. The pad region PR of the lower semiconductor chip 100 may be provided between the blank region BR and the corner region CR. The pad region PR of the lower semiconductor chip 100 may be provided between the first imaginary line and the corner region CR of the lower semiconductor chip 100.

Referring to FIGS. 1A and 1D, the first bonding wires WB1 may be provided on a top surface of the lower semiconductor chip 100. The first and second lower pads 111 and 112 may be coupled through the first bonding wires WB1 to the first substrate pads 511. The lower semiconductor chip 100 may be coupled through the first bonding wires WB1 to the substrate 500. In this description, the phrase "coupled to a semiconductor chip" may include being "coupled to integrated circuits of the semiconductor chip." The first bonding wires WB1 may include metal, such as gold (Au). The second lower pads 112 may be provided on the pad region PR of the lower semiconductor chip 100, but may not be provided on the blank region BR. Therefore, it may be possible to easily perform a bonding process between the first bonding wires WB1 and the first lower pads 111 and between the second bonding wires WB2 and the second lower pads 112.

An upper semiconductor chip may be disposed on the top surface of the lower semiconductor chip 100. The upper semiconductor chip may be the first upper semiconductor chip 210. The first upper semiconductor chip 210 may include a memory chip, such as a dynamic random-access memory (DRAM). Alternatively, the first upper semiconductor chip 210 may be, for example, a logic chip or a buffer chip. The first upper semiconductor chip 210 may be of the same type as the lower semiconductor chip 100. The first upper semiconductor chip 210 may have the same size and storing capacity as that of the lower semiconductor chip 100. Alternatively, the first upper semiconductor chip 210 may be of a different type from the lower semiconductor chip 100 and may have a size different from that of the lower semiconductor chip 100.

The first upper semiconductor chip 210 may have a first lateral surface 210s1, a second lateral surface 210s2, a third lateral surface, and a fourth lateral surface. The second lateral surface 210s2 may neighbor the first lateral surface 210s1 of the first upper semiconductor chip 210. The third lateral surface may stand opposite to the first lateral surface 210s1 of the first upper semiconductor chip 210. The fourth lateral surface may stand opposite to the second lateral surface 210s2 of the first upper semiconductor chip 210. The first lateral surface 210s1 and the third lateral surface of the first upper semiconductor chip 210 may be parallel to the second direction D2. The second lateral surface 210s2 and the fourth lateral surface of the first upper semiconductor chip 210 may be parallel to the first direction D1.

The first upper semiconductor chip 210 may be disposed shifted in the fourth direction D4 from the lower semiconductor chip 100. Therefore, the first upper semiconductor chip 210 may expose the first lower pads 111 and the second lower pads 112.

When viewed in a plan view, the first upper semiconductor chip 210 may have a mounting region R30, a first overhang region R10, a second overhang region R20, and a corner overhang region COR1. When viewed in a plan view, the mounting region R30 of the first upper semiconductor chip 210 may overlap the lower semiconductor chip 100. The mounting region R30 of the first upper semiconductor chip 210 may be called a first mounting region.

When viewed in a plan view, the first overhang region R10 of the first upper semiconductor chip 210 may be spaced apart from the lower semiconductor chip 100. The first overhang region R10 of the first upper semiconductor chip 210 may be provided between the first lateral surface 100s1 of the lower semiconductor chip 100 and the first lateral surface 210s1 of the first upper semiconductor chip 210. The second overhang region R20 of the first upper semiconductor chip 210 may be spaced apart from the lower semiconductor chip 100. The second overhang region R20 of the first upper semiconductor chip 210 may be provided between the second lateral surface 100s2 of the lower semiconductor chip 100 and the second lateral surface 210s2 of the first upper semiconductor chip 210.

When viewed in a plan view, the corner overhang region COR1 of the first upper semiconductor chip 210 may be spaced apart from the lower semiconductor chip 100 and may be adjacent to a corner of the first upper semiconductor chip 210. The corner of the first upper semiconductor chip 210 may be a portion where the first lateral surface 210s1 meets the second lateral surface 210s2 of the first upper semiconductor chip 210. The corner overhang region COR1 of the first upper semiconductor chip 210 may be provided between the first overhang region R10 and the second lateral surface 210s2 of the first upper semiconductor chip 210 and between the second overhang region R20 and the first lateral surface 210s1 of the first upper semiconductor chip 210. The corner overhang region COR1 of the first upper semiconductor chip 210 may be provided between the first lateral surface 210s1 of the first upper semiconductor chip 210 and an imaginary extending line of the first lateral surface 100s1 of the lower semiconductor chip 100 and between the second lateral surface 210s2 of the first upper semiconductor chip 210 and an imaginary extending line of the second lateral surface 100s2 of the lower semiconductor chip 100. The corner overhang region COR1 of the first upper semiconductor chip 210 may be called a first corner overhang region.

The first upper semiconductor chip 210 may include first upper integrated circuits and upper pads. The first upper integrated circuits may be provided in the first upper semiconductor chip 210. The upper pads may include first upper pads 211 and a second upper pad 212. The first upper pads 211 and the second upper pad 212 may be redistribution pads and/or chip pads of the first upper semiconductor chip 210. The first upper pads 211 and the second upper pad 212 may be provided on a top surface of the first upper semiconductor chip 210 and may be electrically connected to the first upper integrated circuits.

The first upper pads 211 may be provided on the first overhang region R10 of the first upper semiconductor chip 210. The first upper pads 211 may be adjacent to the first lateral surface 210s1 of the first upper semiconductor chip 210. The first upper pads 211 may be aligned along the second direction D2. The second upper pad 212 may be provided on the first overhang region R10 of the first upper semiconductor chip 210. The second upper pad 212 may be adjacent to the second lateral surface 210s2 to the first upper semiconductor chip 210. The second upper pad 212 may be provided in plural, and the plurality of second upper pads 212 may be aligned along the first direction D1. As the second upper pad 212 is provided, the first upper pads 211 may not be provided on the corner overhang region COR1 of the first upper semiconductor chip 210. Differently from that shown, the first upper semiconductor chip 210 may include a single second upper pad 212. The following will describe a plurality of second upper pads 212, but the present disclosure is not limited thereto.

The number of the second upper pads 212 may be less than that of the first upper pads 211. For example, the number of the second upper pads 212 may be about 1% to about 50% of that of the first upper pads 211. An interval between the second upper pads 212 may be the same as or different from that between the first upper pads 211. The second upper pads 212 may each have a size substantially the same as that each of the first upper pads 211, but the present disclosure is not limited thereto. The first and second upper pads 211 and 212 may include metal, such as one or more of aluminum, copper, nickel, and any alloy thereof.

The placement of the first upper semiconductor chip 210 may include preparing the first upper semiconductor chip 210 of the same type as the lower semiconductor chip 100, allowing the first upper semiconductor chip 210 to symmetrically rotate 180 degrees with respect to the lower semiconductor chip 100, and allowing the first upper semiconductor chip 210 to be shifted with respect to the lower semiconductor chip 100. Therefore, the number and size of the first upper pads 211 of the first upper semiconductor chip 210 may be substantially the same as that of the first lower pads 111 of the lower semiconductor chip 100. The number and size of the second upper pads 212 may be substantially the same as that of the second lower pads 112 of the lower semiconductor chip 100. The present disclosure, however, is not limited thereto.

The second bonding wires WB2 may be provided on the top surface of the first upper semiconductor chip 210. The second bonding wires WB2 may be coupled to the second substrate pads 512 and to the first and second upper pads 211 and 212. Therefore, the first upper semiconductor chip 210 may be electrically connected through the second bonding wires WB2 to the substrate 500. The second bonding wires WB2 may be spaced apart and electrically separated from the lower semiconductor chip 100. The second bonding wires WB2 may include metal, such as gold (Au).

In a process of forming the second bonding wires WB2, ends of the second bonding wires WB2 may be in contact with the first upper pads 211. Thus, a pressure or force may be applied to the top surface of the first upper semiconductor chip 210. When the first upper pads 211 are disposed on a top surface at the corner overhang region COR1 of the first upper semiconductor chip 210, the first upper pads 211 on the corner overhang region COR1 of the first upper semiconductor chip 210 may be aligned in the second direction D2 with the first upper pads 211 on the first overhang region R10 of the first upper pads 211. When viewed in a plan view, there may be a relatively small interval between the lower semiconductor chip 100 and the first upper pads 211 on the first overhang region R10 of the first upper semiconductor chip 210. When viewed in a plan view, an interval between the lower semiconductor chip 100 and the first upper pads 211 on the corner overhang region COR1 of the first upper semiconductor chip 210 may be greater than that between the lower semiconductor chip 100 and the first upper pads 211 on the first overhang region R10 of the first upper semiconductor chip 210. Therefore, in the process of forming the second bonding wires WB2, the lower semiconductor chip 100 may be difficult to sufficiently support the first upper pads 211 on the corner overhang region COR1 of the second upper semiconductor chip 220. During the formation of the second bonding wires WB2, the corner overhang region COR1 of the first upper semiconductor chip 210 may become downwardly bent due to a force applied to the first upper pads 211 on the corner overhang region COR1 of the first upper semiconductor chip 210, which may result in damage to the corner overhang region COR1 of the first upper semiconductor chip 210. For example, there may be occurrence of crack on the corner overhang region COR1 of the first upper semiconductor chip 210.

According to some embodiments, as the second upper pads 212 are provided, neither the first upper pads 211 nor the second bonding wires WB2 may be provided on the corner overhang region COR1 of the first upper semiconductor chip 210. Therefore, it may be possible to prevent the occurrence of crack on the corner overhang region COR1 of the first upper semiconductor chip 210 and to increase reliability and durability of the first upper semiconductor chip 210.

When viewed in a plan view, an interval between the second upper pads 212 and the lower semiconductor chip 100 may be substantially the same as that between the first upper pads 211 and the lower semiconductor chip 100. Neither the first overhang region R10 nor the second overhang region R20 of the first upper semiconductor chip 210 may become bent in the process of forming the second bonding wires WB2. Thus, the occurrence of crack may be prevented on the first and second overhang regions R10 and R20 of the first upper semiconductor chip 210.

The second overhang region R20 of the first upper semiconductor chip 210 may include a first pad region PR1 and a first blank region BR1. When viewed in a plan view, the first blank region BR1 of the first upper semiconductor chip 210 may be adjacent to the third lateral surface of the first upper semiconductor chip 210. The first blank region BR1 of the first upper semiconductor chip 210 may be provided between a second imaginary line and the third lateral surface of the first upper semiconductor chip 210. The second imaginary line may be parallel to the second direction D2 while passing through a midpoint of the second lateral surface 210s2 of the first upper semiconductor chip 210. The first pad region PR1 of the first upper semiconductor chip 210 may be provided between the first blank region BR1 and the corner overhang region COR1 of the first upper semiconductor chip 210. The first pad region PR1 of the first upper semiconductor chip 210 may be provided between the second imaginary line and the corner overhang region COR1. The second upper pads 212 may be provided on the first pad region PR1 of the first upper semiconductor chip 210 and may not be provided on the first blank region BR1. Therefore, it may be possible to easily perform a bonding process between the second bonding wires WB2 and the first upper pads 211 and between the second bonding wires WB2 and the second upper pads 212.

The first upper semiconductor chip 210 may include no metal pads on a bottom surface thereof. The second bonding wires WB2 may not be provided on the bottom surface of the first upper semiconductor chip 210.

As illustrated in FIGS. 1B and 1D, the semiconductor package 1 may further include a second upper semiconductor chip 220. The second upper semiconductor chip 220 may be disposed on the top surface of the first upper semiconductor chip 210. The second upper semiconductor chip 220 may include a memory chip, such as a dynamic random-access memory (DRAM). Alternatively, the second upper semiconductor chip 220 may be, for example, a logic chip or a buffer chip. The second upper semiconductor chip 220 may be of the same type as the first upper semiconductor chip 210. The second upper semiconductor chip 220 may have the same size and storing capacity as that of the first upper semiconductor chip 210. Alternatively, the second upper semiconductor chip 220 may be of a different type from the first upper semiconductor chip 210 and may have a different size from that of the first upper semiconductor chip 210.

The second upper semiconductor chip 220 may have a first lateral surface 220s1, a second lateral surface 220s2, a third lateral surface, and a fourth lateral surface. The second lateral surface 220s2 may neighbor the first lateral surface 220s1 of the second upper semiconductor chip 220. The third lateral surface may stand opposite to the first lateral surface 220s1 of the second upper semiconductor chip 220. The fourth lateral surface may stand opposite to the second lateral surface 220s2 of the second upper semiconductor chip 220. The first lateral surface 220s1 and the third lateral surface of the second upper semiconductor chip 220 may be parallel to the second direction D2. The second lateral surface 220s2 and the fourth lateral surface of the second upper semiconductor chip 220 may be parallel to the first direction D1.

The second upper semiconductor chip 220 may be shifted from the first upper semiconductor chip 210 in a direction opposite to the fourth direction D4. Therefore, the second upper semiconductor chip 220 may expose the first upper pads 211 and the second upper pads 212.

When viewed in a plan view, the second upper semiconductor chip 220 may have a mounting region R31, a first overhang region R11, a second overhang region R21, and a corner overhang region COR2. The mounting region R31 of the second upper semiconductor chip 220 may overlap the first upper semiconductor chip 210. The mounting region R31 of the second upper semiconductor chip 220 may be called a second mounting region. When viewed in a plan view, the first overhang region R11 of the second upper semiconductor chip 220 may be spaced apart from the first upper semiconductor chip 210. The first overhang region R11 of the second upper semiconductor chip 220 may be adjacent to the first lateral surface 220s1 of the second upper semiconductor chip 220. For example, the first overhang region R11 of the second upper semiconductor chip 220 may be provided between the third lateral surface of the first upper semiconductor chip 210 and the first lateral surface 220s1 of the second upper semiconductor chip 220. The first overhang region R11 of the second upper semiconductor chip 220 may be called a third overhang region. When viewed in a plan view, the second overhang region R21 of the second upper semiconductor chip 220 may be spaced apart from the first upper semiconductor chip 210. The second overhang region R21 of the second upper semiconductor chip 220 may be adjacent to the second lateral surface 220s2 of the second upper semiconductor chip 220. For example, the second overhang region R21 of the second upper semiconductor chip 220 may be provided between the fourth lateral surface of the first upper semiconductor chip 210 and the second lateral surface 220s2 of the second upper semiconductor chip 220. The second overhang region R21 of the second upper semiconductor chip 220 may be called a fourth overhang region.

When viewed in a plan view, the corner overhang region COR2 of the second upper semiconductor chip 220 may be spaced apart from the first upper semiconductor chip 210 and may be adjacent to a corner of the second upper semiconductor chip 220. The corner of the second upper semiconductor chip 220 may be a portion where the first lateral surface 220s1 meets the second lateral surface 220s2 of the second upper semiconductor chip 220. The corner overhang region COR2 of the second upper semiconductor chip 220 may be provided between the first overhang region R11 and the second lateral surface 220s2 of the second upper semiconductor chip 220 and between the second overhang region R21 and the first lateral surface 220s1 of the second upper semiconductor chip 220. The corner overhang region COR2 of the second upper semiconductor chip 220 may be provided between the first lateral surface 220s1 of the second upper semiconductor chip 220 and an imaginary extending line of the third lateral surface of the first upper semiconductor chip 210 and between the second lateral surface 220s2 of the second upper semiconductor chip 220 and an imaginary extending line of the fourth lateral surface of the first upper semiconductor chip 210. The corner overhang region COR2 of the second upper semiconductor chip 220 may be called a second corner overhang region.

The second upper semiconductor chip 220 may include second upper integrated circuits and conductive pads. The second upper integrated circuits may be provided in the second upper semiconductor chip 220. The conductive pads may include first conductive pads 221 and a second conductive pad 222. The first conductive pads 221 and the second conductive pad 222 may be provided on a top surface of the second upper semiconductor chip 220 and may be electrically connected to the second upper integrated circuits. The first conductive pads 221 and the second conductive pad 222 may be redistribution pads and/or chip pads of the second upper semiconductor chip 220. The first conductive pads 221 may be provided on a top surface at the first overhang region R11 of the second upper semiconductor chip 220. The first conductive pads 221 may be aligned along the second direction D2. The second conductive pad 222 may be provided on a top surface at the second overhang region R21 of the second upper semiconductor chip 220. The second conductive pad 222 may be provided in plural, and the plurality of second conductive pads 222 may be aligned along the first direction D1. As the second conductive pad 222 is provided, the first conductive pads 221 may not be provided on the corner overhang region COR2 of the second upper semiconductor chip 220.

An interval between the second conductive pads 222 may be the same as or different from that between the first conductive pads 221. The second conductive pad 222 may have a size substantially the same as that of each of the first conductive pads 221, but the present disclosure is not limited thereto. The first and second conductive pads 221 and 222 may include metal, such as one or more of aluminum, copper, nickel, and any alloy thereof. Differently from that shown, the second upper semiconductor chip 220 may include a single second conductive pad 222. The following will describe a plurality of second conductive pads 222 in the interest of convenience of description, but the present disclosure is not limited thereto.

The placement of the second upper semiconductor chip 220 may include preparing the second upper semiconductor chip 220 of the same type as the first upper semiconductor chip 210, allowing the second upper semiconductor chip 220 to symmetrically rotate 180 degrees with respect to the first upper semiconductor chip 210, and allowing the second upper semiconductor chip 220 to be shifted with respect to the first upper semiconductor chip 210. Therefore, the number and size of the first conductive pads 221 of the second upper semiconductor chip 220 may be substantially the same as that of the first upper pads 211 of the first upper semiconductor chip 210. The number and size of the second conductive pads 222 may be substantially the same as that of the second upper pads 212. The present disclosure, however, is not limited thereto.

Third bonding wires WB3 may be provided on the top surface of the second upper semiconductor chip 220. The first and second conductive pads 221 and 222 may be coupled through the third bonding wires WB3 to the third substrate pads 513. Therefore, the second upper semiconductor chip 220 may be electrically connected to the substrate 500. The third bonding wires WB3 may be spaced apart and electrically separated from the lower semiconductor chip 100 and the first upper semiconductor chip 210. The third bonding wires WB3 may include metal, such as gold (Au).

In a process of forming the third bonding wires WB3, ends of the third bonding wires WB3 may be in contact with the first conductive pads 221. When the first conductive pads 221 are disposed on the top surface at the corner overhang region COR2 of the second upper semiconductor chip 220, the corner overhang region COR2 of the second upper semiconductor chip 220 may become downwardly bent in the process of forming the third bonding wires WB3. In this case, damage may be incurred on the corner overhang region COR2 of the second upper semiconductor chip 220. For example, the occurrence of a crack may be included in the damage to the corner overhang region COR2 of the second upper semiconductor chip 220.

According to some embodiments, neither the second upper pads 212 nor the third bonding wires WB3 may be provided on the corner overhang region COR2 of the second upper semiconductor chip 220. Therefore, it may be possible to prevent the occurrence of the crack on the corner overhang region COR2 of the second upper semiconductor chip 220 and to increase reliability and durability of the second upper semiconductor chip 220.

When viewed in a plan view, an interval between the second conductive pads 222 and the lower semiconductor chip 100 may be substantially the same as that between the first conductive pads 221 and the lower semiconductor chip 100. Neither the first overhang region R11 nor the second overhang region R21 of the second upper semiconductor chip 220 may become bent in the process of forming the third bonding wires WB3. Therefore, the occurrence of the crack may be effectively prevented on the first overhang region R11 and the second overhang region R21 of the second upper semiconductor chip 220.

The second overhang region R21 of the second upper semiconductor chip 220 may include a second pad region PR2 and a second blank region BR2. When viewed in a plan view, the second blank region BR2 of the second upper semiconductor chip 220 may be adjacent to the third lateral surface of the second upper semiconductor chip 220. The second blank region BR2 may be provided between a third imaginary line and the third lateral surface of the second upper semiconductor chip 220. The third imaginary line may be parallel to the second direction D2 while passing through a midpoint of the second lateral surface 220s2 of the second upper semiconductor chip 220. The second pad region PR2 of the second upper semiconductor chip 220 may be provided between the second blank region BR2 and the corner overhang region COR2 of the second upper semiconductor chip 220. The second pad region PR2 of the second upper semiconductor chip 220 may be provided between the third imaginary line and the corner overhang region COR2 of the second upper semiconductor chip 220. The second conductive pads 222 may be provided on the second pad region PR2 of the second upper semiconductor chip 220 and may not be provided on the second blank region BR2. Therefore, it may be possible to easily perform a bonding process between the third bonding wires WB3 and the first and second conductive pads 221 and 222.

As illustrated in FIG. 1D, the first substrate pads 511 may be provided between the lower semiconductor chip 100 and the third substrate pads 513. Therefore, the third bonding wires WB3 may be spaced apart from the first bonding wires WB1. An electrical short may be prevented between the first bonding wires WB1 and the third bonding wires WB3.

The second upper semiconductor chip 220 may include no metal pads on a bottom surface thereof. The third bonding wires WB3 may not be provided on the bottom surface of the second upper semiconductor chip 220.

Referring to FIGS. 1A, 1B, and 1D, when viewed in a plan view, the second upper semiconductor chip 220 may overlap the lower semiconductor chip 100. The number and arrangement of the first conductive pads 221 may be substantially the same as that of the first lower pads 111. The number and arrangement of the second conductive pads 222 may be substantially the same as that of the second lower pads 112. The present disclosure, however, is not limited thereto. As illustrated in FIGS. 1D to 1F, the second upper semiconductor chip 220 may have lateral surfaces vertically aligned with those of the lower semiconductor chip 100. In this description, the term "vertically" may mean the expression "parallel to the third direction D3."

As illustrated in FIGS. 1C and 1D, the semiconductor package 1 may further include a third upper semiconductor chip 230. The third upper semiconductor chip 230 may be disposed on the top surface of the second upper semiconductor chip 220. The third upper semiconductor chip 230 may include a memory chip, such as a dynamic random-access memory (DRAM). Alternatively, the third upper semiconductor chip 230 may be, for example, a logic chip or a buffer chip.

The third upper semiconductor chip 230 may have a first lateral surface 230s1, a second lateral surface 230s2, a third lateral surface, and a fourth lateral surface. The second lateral surface 230s2 may neighbor the first lateral surface 230s1 of the third upper semiconductor chip 230. The third lateral surface may stand opposite to the first lateral surface 230s1 of the third upper semiconductor chip 230. The fourth lateral surface may stand opposite to the second lateral surface 230s2 of the third upper semiconductor chip 230. The first lateral surface 230s1 and the third lateral surface of the third upper semiconductor chip 230 may be parallel to the second direction D2. The second lateral surface 230s2 and the fourth lateral surface of the third upper semiconductor chip 230 may be parallel to the first direction D1.

The third upper semiconductor chip 230 may be shifted from the second upper semiconductor chip 220 in a direction opposite to the fourth direction D4. Therefore, the third upper semiconductor chip 230 may expose the first conductive pads 221 and the second conductive pads 222.

When viewed in a plan view, the third upper semiconductor chip 230 may have a mounting region R32, a first overhang region R12, a second overhang region R22, and a corner overhang region COR3. The mounting region R32 of the third upper semiconductor chip 230 may overlap the second upper semiconductor chip 220. The first overhang region R12 of the third upper semiconductor chip 230 may be spaced apart from the second upper semiconductor chip 220. When viewed in a plan view, the first overhang region R12 of the third upper semiconductor chip 230 may be provided between the third lateral surface of the second upper semiconductor chip 220 and the first lateral surface 230s1 of the third upper semiconductor chip 230. The second overhang region R22 of the third upper semiconductor chip 230 may be spaced apart from the second upper semiconductor chip 220. The second overhang region R22 of the third upper semiconductor chip 230 may be provided between the fourth lateral surface of the second upper semiconductor chip 220 and the second lateral surface 230s2 of the third upper semiconductor chip 230.

When viewed in a plan view, the corner overhang region COR3 of the third upper semiconductor chip 230 may be spaced apart from the second upper semiconductor chip 220 and may be adjacent to a corner of the third upper semiconductor chip 230. The third and fourth lateral surfaces of the third upper semiconductor chip 230 may meet each other on a corner of the third upper semiconductor chip 230. The corner overhang region COR3 of the third upper semiconductor chip 230 may be provided between the first overhang region R12 and the second lateral surface 230s2 of the third upper semiconductor chip 230 and between the second overhang region R22 and the first lateral surface 230s1 of the third upper semiconductor chip 230. The corner overhang region COR3 of the third upper semiconductor chip 230 may be provided between the first lateral surface 230s1 of the third upper semiconductor chip 230 and an imaginary extending line of the third lateral surface of the second upper semiconductor chip 220 and between the second lateral surface 230s2 of the third upper semiconductor chip 230 and an imaginary extending line of the fourth lateral surface of the second upper semiconductor chip 220.

The third upper semiconductor chip 230 may include third upper integrated circuits, first bonding pads 231, and a second bonding pad 232. The third upper integrated circuits may be provided in the third upper semiconductor chip 230. The first bonding pads 231 and the second bonding pad 232 may be provided on a top surface of the third upper semiconductor chip 230 and may be electrically connected to the third upper integrated circuits. The first bonding pads 231 and the second bonding pad 232 may be redistribution pads and/or chip pads of the third upper semiconductor chip 230. The first bonding pads 231 may be provided on a top surface at the first overhang region R12 of the third upper semiconductor chip 230. The first bonding pads 231 may be aligned along the second direction D2 while being adjacent to the first lateral surface 230s1 of the third upper semiconductor chip 230. The second bonding pad 232 may be provided on a top surface at the second overhang region R22 of the third upper semiconductor chip 230. For example, the second bonding pad 232 may be provided in plural, and the plurality of second bonding pads 232 may be aligned along the first direction D1. As the second bonding pad 232 is provided, the first bonding pads 231 may not be provided on the corner overhang region COR3 of the third upper semiconductor chip 230. The number of the second bonding pads 232 may be less than that of the first bonding pads 231. For example, the number of the second bonding pads 232 may be about 1% to about 50% of that of the first bonding pads 231. Differently from that shown, the third upper semiconductor chip 230 may include a single second bonding pad 232. The following will describe a plurality of second bonding pads 232 in the interest of convenience, but the present disclosure is not limited thereto.

An interval between the second bonding pads 232 may be the same as or different from that between the first bonding pads 231. The second bonding pads 232 may each have a size substantially the same as that of each of the first bonding pads 231, but the present disclosure is not limited thereto. The first and second bonding pads 231 and 232 may include metal, such as one or more of aluminum, copper, nickel, and any alloy thereof.

The third upper semiconductor chip 230 may be of the same type as the second upper semiconductor chip 220. The third semiconductor chip 230 may have the same size and storing capacity as that of the second upper semiconductor chip 220. The placement of the third upper semiconductor chip 230 may include preparing the third upper semiconductor chip 230 of the same type as the second upper semiconductor chip 220, allowing the third upper semiconductor chip 230 to symmetrically rotate 180 degrees with respect to the second upper semiconductor chip 220, and allowing the third upper semiconductor chip 230 to be shifted with respect to the second upper semiconductor chip 220. Therefore, the number and size of the first bonding pads 231 of the third upper semiconductor chip 230 may be substantially the same as that of the first conductive pads 221 of the second upper semiconductor chip 220. The number and size of the second bonding pads 232 may be substantially the same as that of the second conductive pads 222. Alternatively, the third upper semiconductor chip 230 may be of a different type from the second upper semiconductor chip 220 and may have a different size from that of the second upper semiconductor chip 220.

Referring to FIGS. 1B to 1F, when viewed in a plan view, the third upper semiconductor chip 230 may overlap the first upper semiconductor chip 210. The number and arrangement of the first bonding pads 231 may be substantially the same as that of the first upper pads 211. The number and arrangement of the second bonding pads 232 may be substantially the same as that of the second upper pads 212. The present disclosure, however, is not limited thereto. As illustrated in FIGS. 1D to 1F, the third upper semiconductor chip 230 may have lateral surfaces vertically aligned with those of the first upper semiconductor chip 210.

Fourth bonding wires WB4 may be provided on the top surface of the third upper semiconductor chip 230. The fourth bonding wires WB4 may be coupled to the fourth substrate pads 514 and to the first and second bonding pads 231 and 232. Therefore, the third upper semiconductor chip 230 may be electrically connected to the substrate 500. The fourth bonding wires WB4 may be spaced apart from the lower semiconductor chip 100, the first upper semiconductor chip 210, and the second upper semiconductor chip 220. The fourth bonding wires WB4 may include metal, such as gold (Au).

According to some embodiments, neither the first bonding pads 231 nor the fourth bonding wires WB4 may be provided on the corner overhang region COR3 of the third upper semiconductor chip 230. Therefore, it may be possible to prevent the occurrence of a crack on the corner overhang region COR3 of the third upper semiconductor chip 230 and to increase reliability and durability of the third upper semiconductor chip 230.

When viewed in a plan view, an interval between the second bonding pads 232 and the second upper semiconductor chip 220 may be substantially the same as that between the first bonding pads 231 and the second upper semiconductor chip 220. Neither the first overhang region R12 nor the second overhang region R22 of the third upper semiconductor chip 230 may become bent in a process of forming the fourth bonding wires WB4. Therefore, the occurrence of the crack may be prevented on the first overhang region R12 and the second overhang region R22 of the third upper semiconductor chip 230.

As illustrated in FIG. 1C, when viewed in a plan view, the second overhang region R22 of the third upper semiconductor chip 230 may include a third pad region PR3 and a third blank region BR3. When viewed in a plan view, the third blank region BR3 of the third upper semiconductor chip 230 may be adjacent to the third lateral surface of the third upper semiconductor chip 230. The third blank region BR3 may be provided between a fourth imaginary line of the third upper semiconductor chip 230 and the third lateral surface of the third upper semiconductor chip 230. The fourth imaginary line may be parallel to the second direction D2 while passing through a midpoint of the second lateral surface 230s2. The third pad region PR3 of the third upper semiconductor chip 230 may be provided between the third blank region BR3 and the corner overhang region COR3 of the third upper semiconductor chip 230. The third pad region PR3 may be provided between the fourth imaginary line and the corner overhang region COR3 of the third upper semiconductor chip 230. The second bonding pads 232 may be provided on the third pad region PR3 of the third upper semiconductor chip 230 but may not be provided on the third blank region BR3. Therefore, it may be possible to easily perform a bonding process between the fourth bonding wires WB4 and the first and second bonding pads 231 and 232.

As illustrated in FIG. 1D, the second substrate pads 512 may be provided between the lower semiconductor chip 100 and the fourth substrate pads 514. Therefore, the fourth bonding wires WB4 may be spaced apart from the second bonding wires WB2 and an electrical short may be prevented between the second bonding wires WB2 and the fourth bonding wires WB4.

The third upper semiconductor chip 230 may include no metal pads on a bottom surface thereof. The fourth bonding wires WB4 may not be provided on the bottom surface of the third upper semiconductor chip 230.

The semiconductor package 1 may further include a molding layer 400. The molding layer 400 may be provided on the top surface of the substrate 500 to cover the lower semiconductor chip 100, the first upper semiconductor chip 210, the second upper semiconductor chip 220, and the third upper semiconductor chip 230. The molding layer 400 may encapsulate the first, second, third, and fourth bonding wires WB1, WB2, WB3, and WB4. The molding layer 400 may have outer sidewalls vertically aligned with sidewalls of the substrate 500. The molding layer 400 may include a dielectric polymer, such as an epoxy-based molding compound.

The semiconductor package 1 may further include adhesive layers 410. The adhesive layers 410 may be provided on a bottom surface of the lower semiconductor chip 100, the bottom surface of the first upper semiconductor chip 210, the bottom surface of the second upper semiconductor chip 220, and the bottom surface of the third upper semiconductor chip 230. The adhesive layers 410 may be die attach films. The adhesive layers 410 may include, for example, a dielectric polymer. The adhesive layers 410 may include a different material from that of the molding layer 400.

Figure 2A:
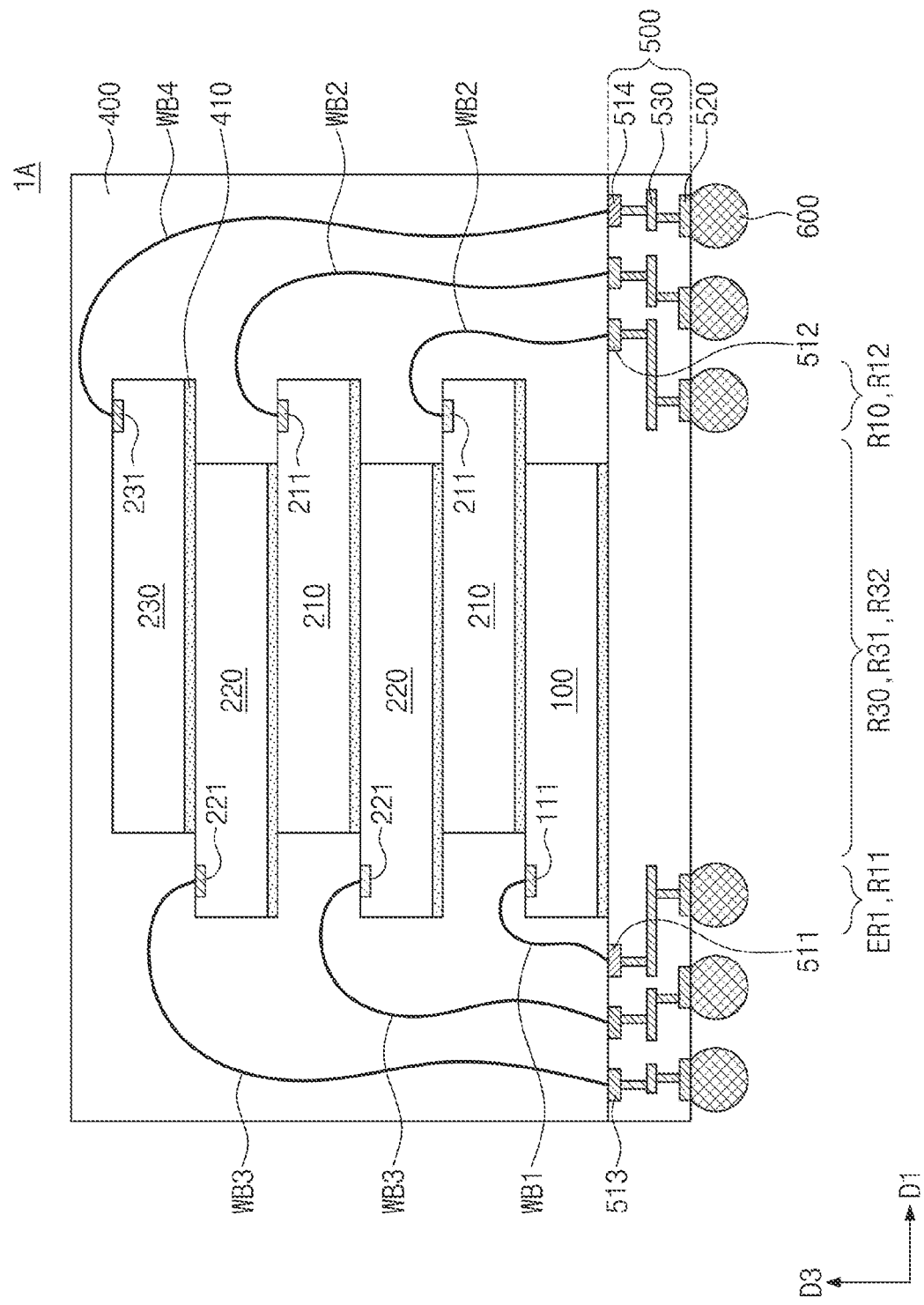
FIGS. 2A to 2C illustrate cross-sectional views showing a semiconductor package according to some embodiments.
Figure 2B:
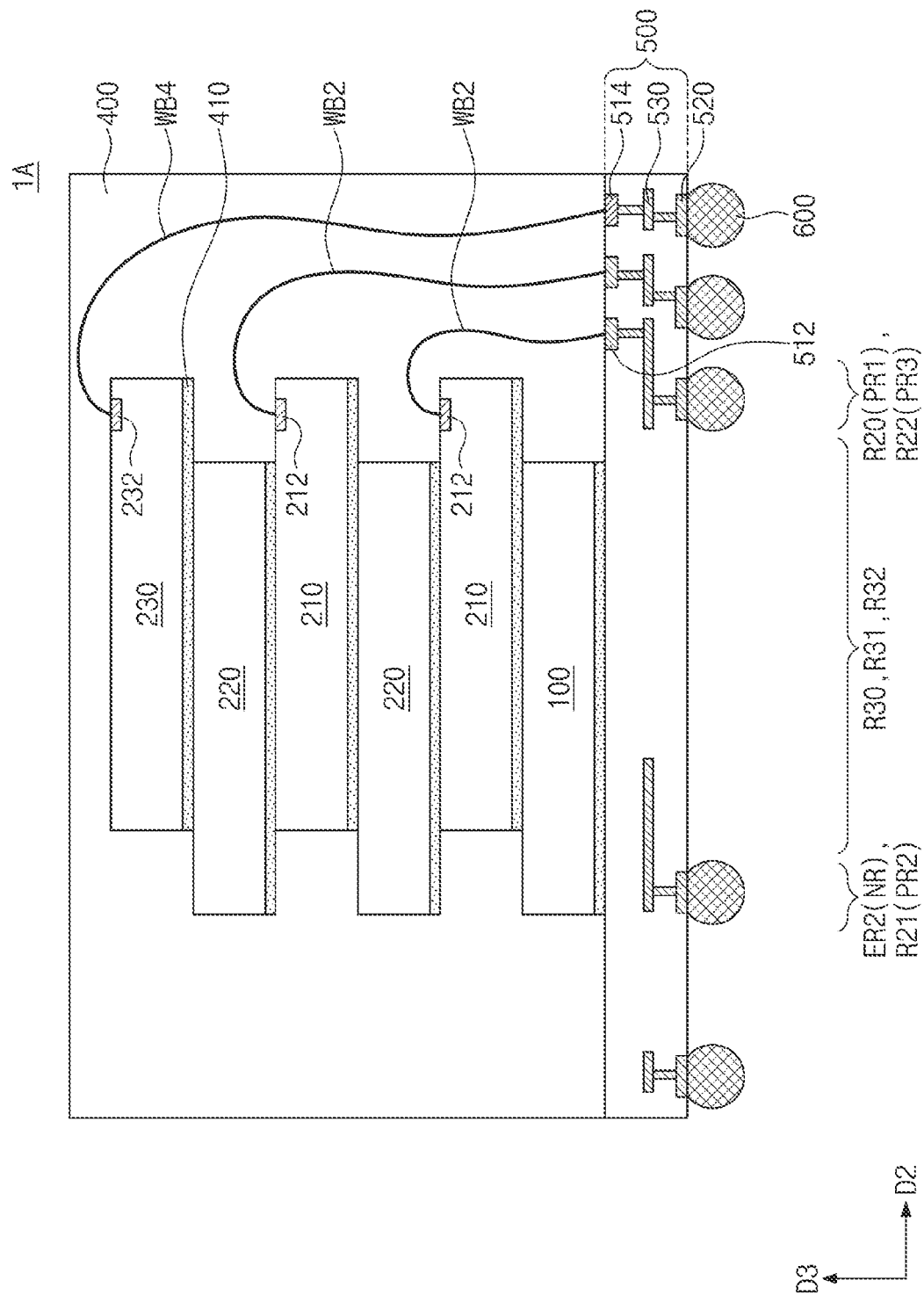
Figure 2C:
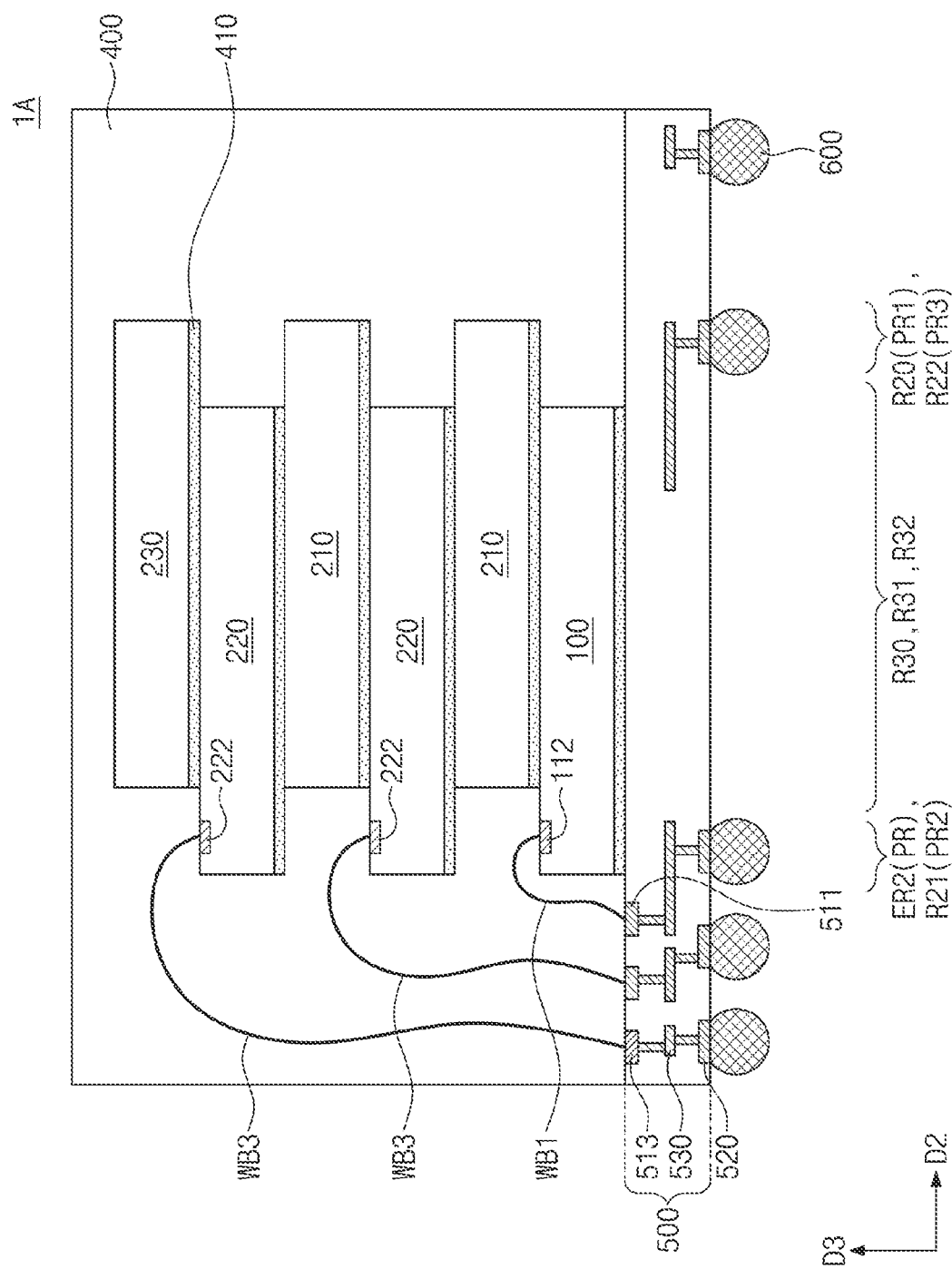

FIG. 2A illustrates a cross-sectional view taken along line I-I' of FIG. 1A, 1B, or 1C showing a semiconductor package according to some embodiments. FIG. 2B illustrates a cross-sectional view taken along line II-II' of FIG. 1A, 1B, or 1C showing a semiconductor package according to some embodiments. FIG. 2C illustrates a cross-sectional view taken along line III-III' of FIG. 1A, 1B, or 1C showing a semiconductor package according to some embodiments. The following description of FIGS. 2A to 2C will also refer to FIGS. 1A to 1B.

Referring to FIGS. 2A to 2C, a semiconductor package 1A may include a substrate 500, solder balls 600, a lower semiconductor chip 100, a plurality of first upper semiconductor chips 210, a plurality of second upper semiconductor chips 220, a plurality of third upper semiconductor chips 230, first bonding wires WB1, second bonding wires WB2, third bonding wires WB3, fourth bonding wires WB4, a molding layer 400, and adhesive layers 410. The substrate 500, the solder balls 600, the lower semiconductor chip 100, the first to third upper semiconductor chips 210 to 230, the first to fourth bonding wires WB1 to WB4, the molding layer 400, and the adhesive layers 410 may be substantially the same as those discussed above in the examples of FIGS. 1A to 1E.

In contrast, the semiconductor package 1A may include a plurality of first upper semiconductor chips 210 and a plurality of second upper semiconductor chips 220. The first upper semiconductor chips 210 and the second upper semiconductor chips 220 may be stacked alternately with each other. The second bonding wires WB2 may be disposed on the second upper semiconductor chips 220 to be coupled to the first upper pads 211 and the second upper pads 212. The third bonding wires WB3 may be disposed on the third upper semiconductor chip 230 to be coupled to the first conductive pads 221 and the second conductive pads 222.

There may be various changes in the number of first upper semiconductor chips 210 and the second upper semiconductor chips 220. For example, the semiconductor package 1A may include a single first upper semiconductor chip 210 but may not include any of the second and third upper semiconductor chips 220 and 230.

Figure 3A:
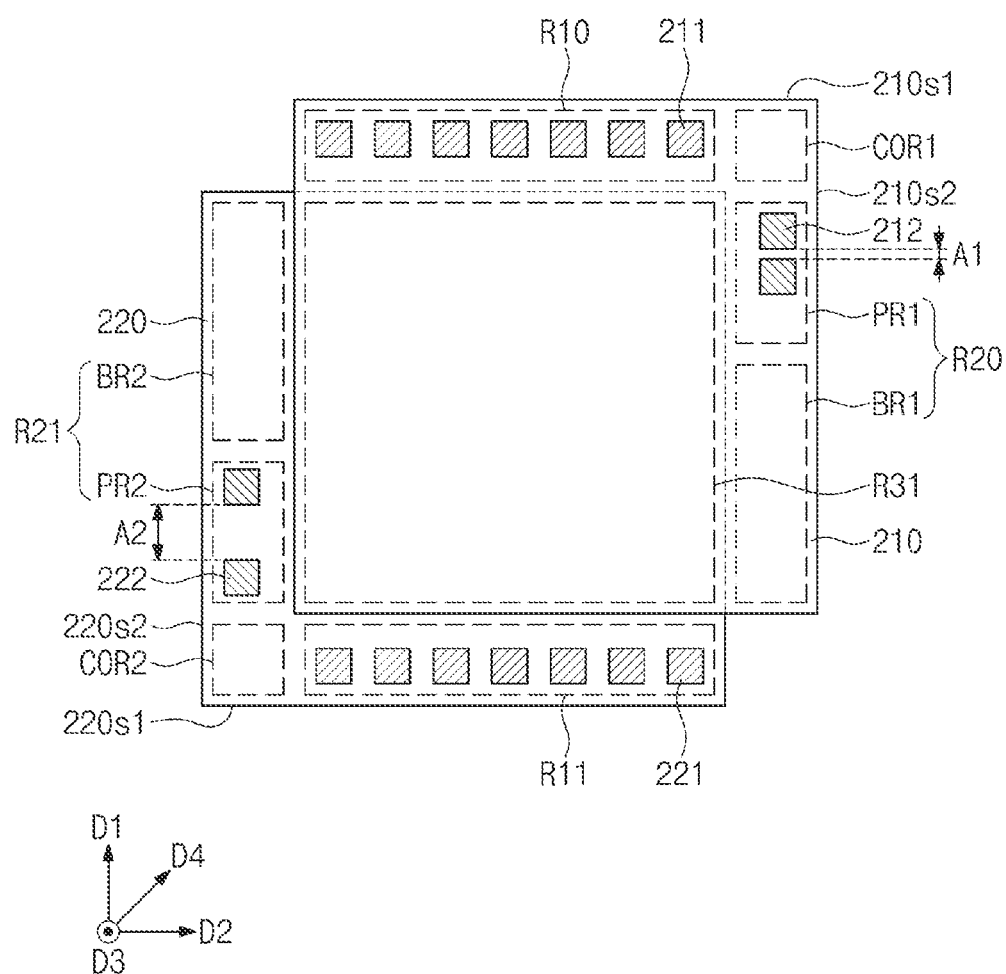
FIG. 3A illustrates a plan view showing an arrangement of first and second upper semiconductor chips according to some embodiments.
Figure 3B:
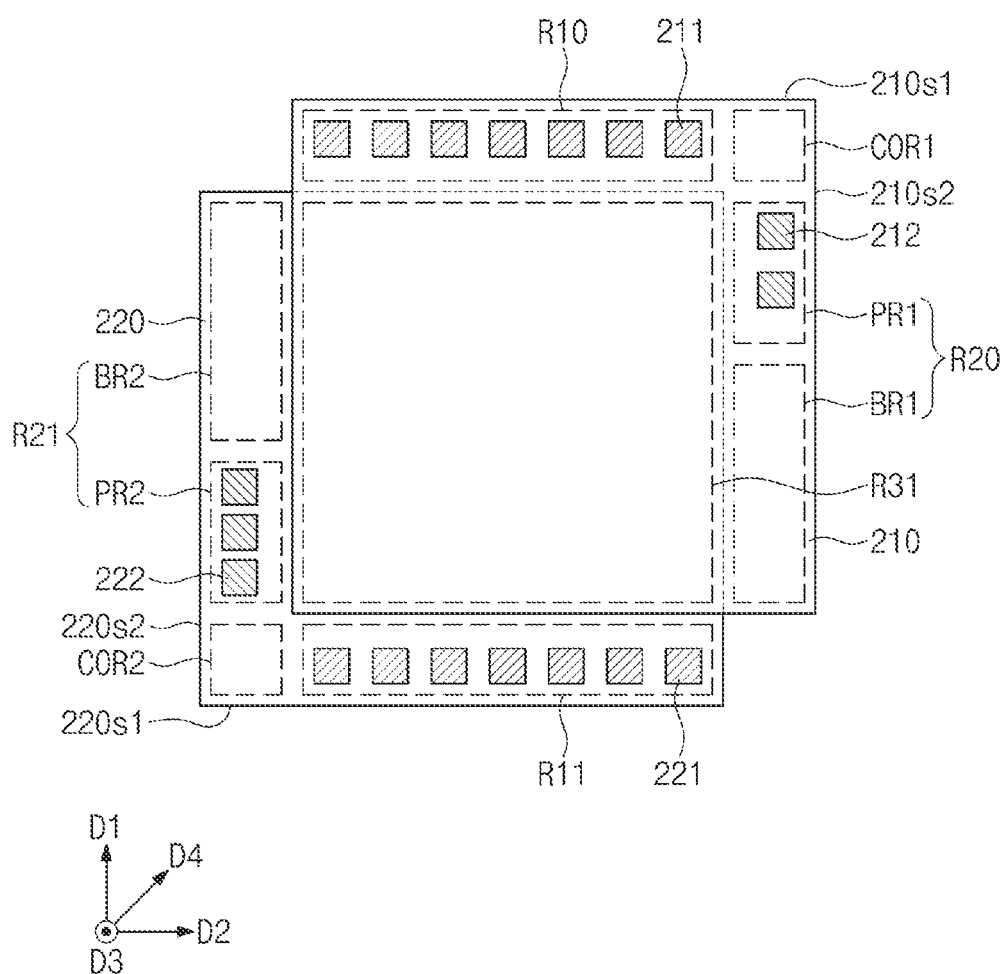
FIG. 3B illustrates a plan view showing an arrangement of first and second upper semiconductor chips according to some embodiments.

FIG. 3A illustrates a plan view showing an arrangement of first and second upper semiconductor chips according to some embodiments. FIG. 3B illustrates a plan view showing an arrangement of first and second upper semiconductor chips according to some embodiments. A duplicate description will be omitted below.

Referring to FIGS. 3A and 3B, a second upper semiconductor chip 220 may be provided on a first upper semiconductor chip 210. The first upper semiconductor chip 210 may include first upper pads 211 and second upper pads 212. The second upper semiconductor chip 220 may include first conductive pads 221 and second conductive pads 222. For example, the second upper semiconductor chip 220 may be a different type from the first upper semiconductor chip 210. An arrangement of the second conductive pads 222 may be different from that of the second upper pads 212.

As illustrated in FIG. 3A, an interval A2 between the second conductive pads 222 may be different from an interval A1 between the second upper pads 212. The interval A2 between the second conductive pads 222 may be greater than the interval A1 between the second upper pads 212. Differently from that shown, the interval A2 between the second conductive pads 222 may be less than the interval A1 between the second upper pads 212.

As illustrated in FIG. 3B, the number of the second conductive pads 222 may be different from that of the second upper pads 212. For example, the number of the second conductive pads 222 may be greater than that of the second upper pads 212. Differently from that shown, the number of the second conductive pads 222 may be less than that of the second upper pads 212.

Unlike FIGS. 3A and 3B, an arrangement of the first conductive pads 221 may be different from that of the first upper pads 211. For example, an interval between the first conductive pads 221 may be different from that between the first upper pads 211. Alternatively, the number of the first conductive pads 221 may be different from that of the first upper pads 211.

The arrangement of the second upper pads 212 and the second conductive pads 222 depicted in FIG. 3A or 3B may be applicable to that of the second lower pads 112 and the second upper pads 212 discussed in the example of FIG. 1A or to that of the second conductive pads 222 and the second bonding pads 232 discussed in the example of FIG. 1C. For example, in the example of FIG. 1A, an interval between the second lower pads 112 may be different from that between the second upper pads 212 of FIG. 1A or the number of the second lower pads 112 may be different from that of the second upper pads 212. In the example of FIG. 1C, an interval between the second conductive pads 222 may be different from that between the second bonding pads 232 or the number of the second conductive pads 222 may be different from that of the second bonding pads 232.

Figure 4A:
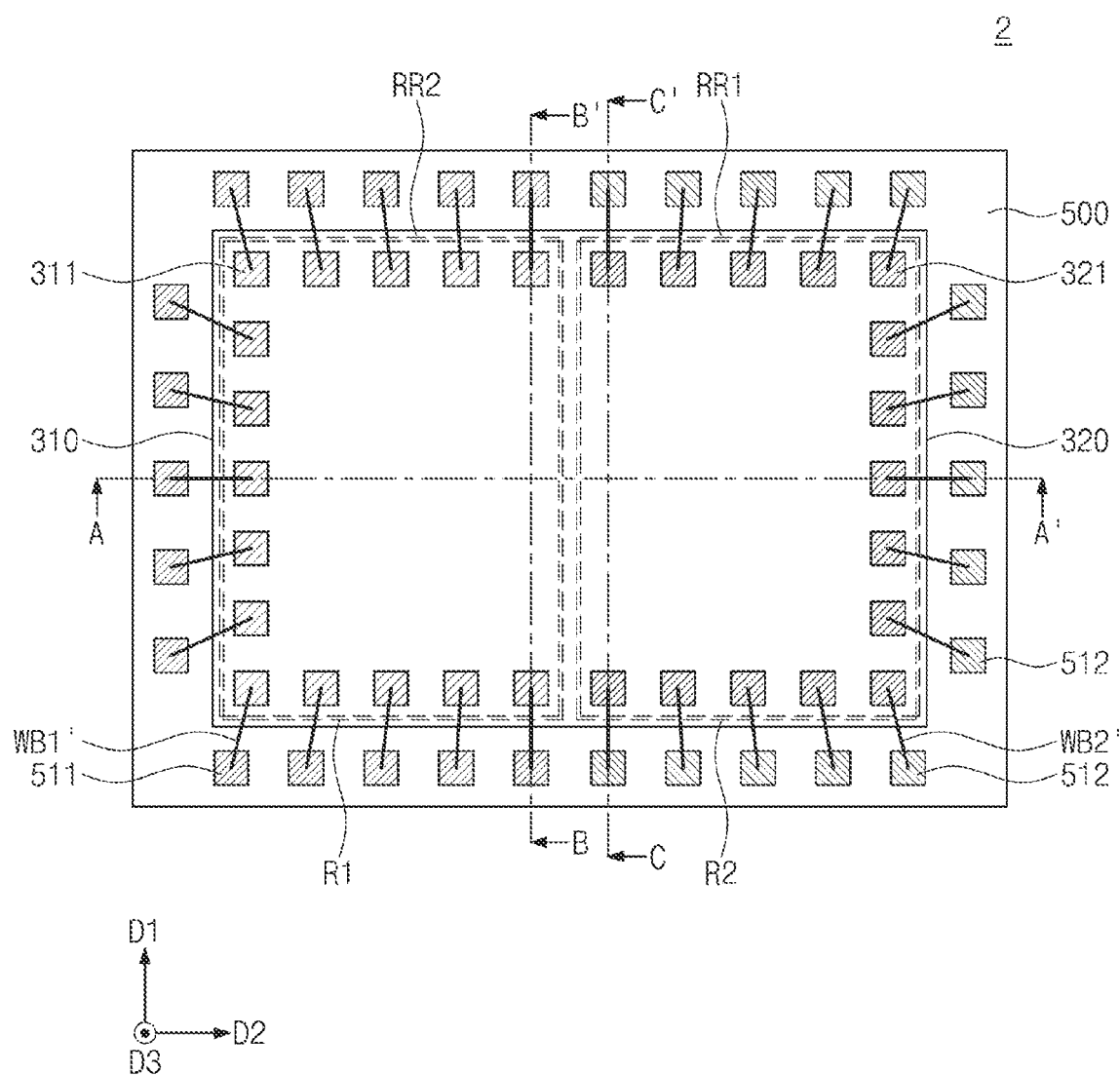
FIG. 4A illustrates a plan view showing a semiconductor package according to some embodiments.
Figure 4B:
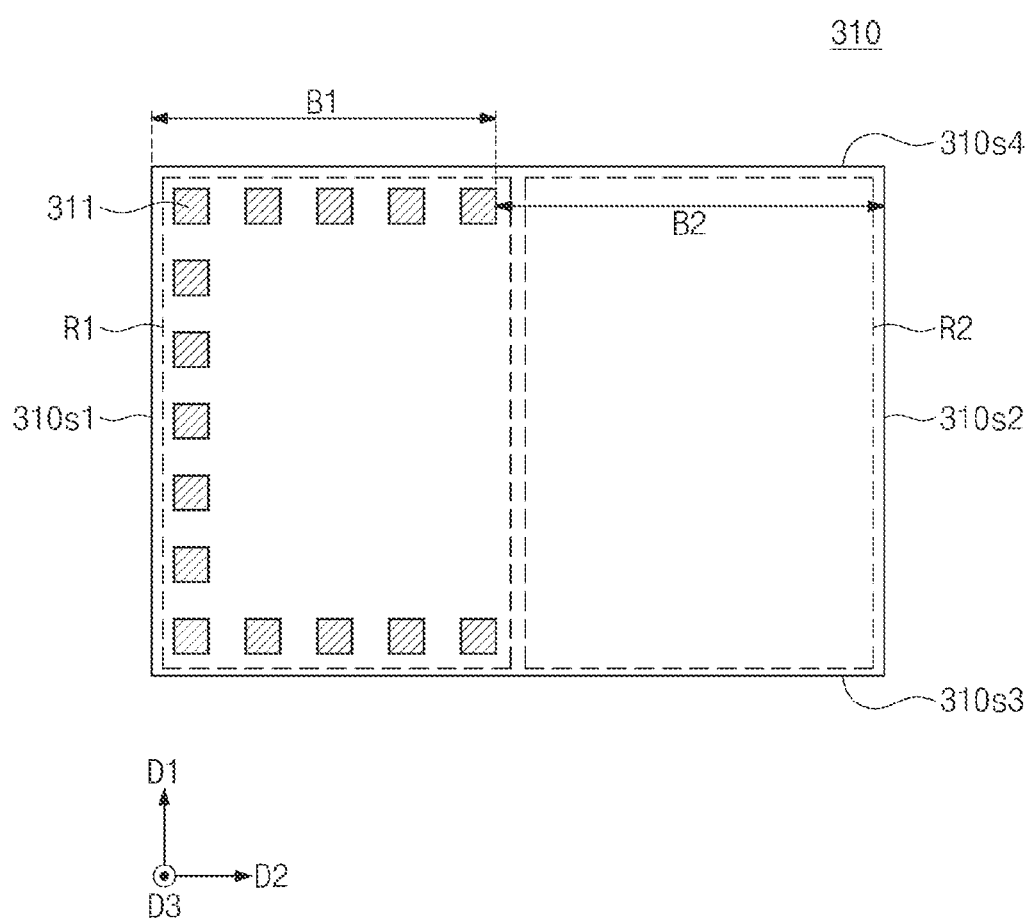
FIG. 4B illustrates a plan view showing a first semiconductor chip according to some embodiments.
Figure 4C:
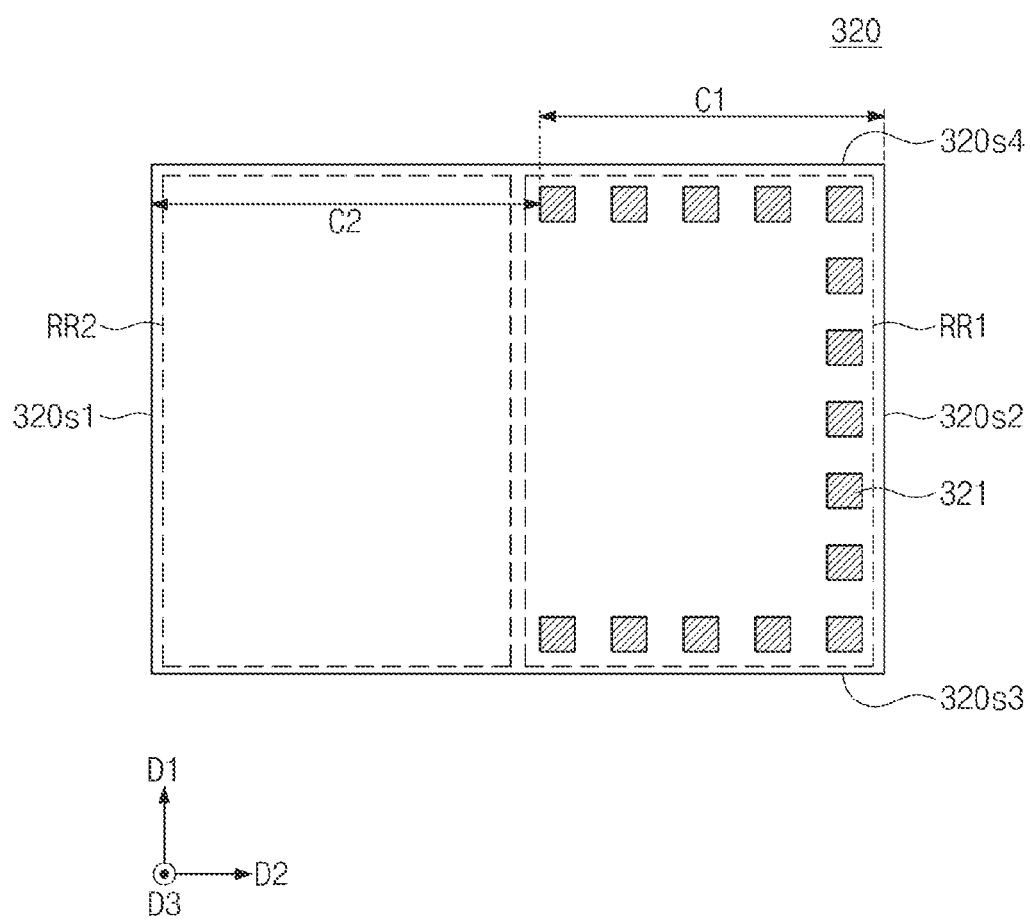
FIG. 4C illustrates a plan view showing a second semiconductor chip according to some embodiments.
Figure 4D:
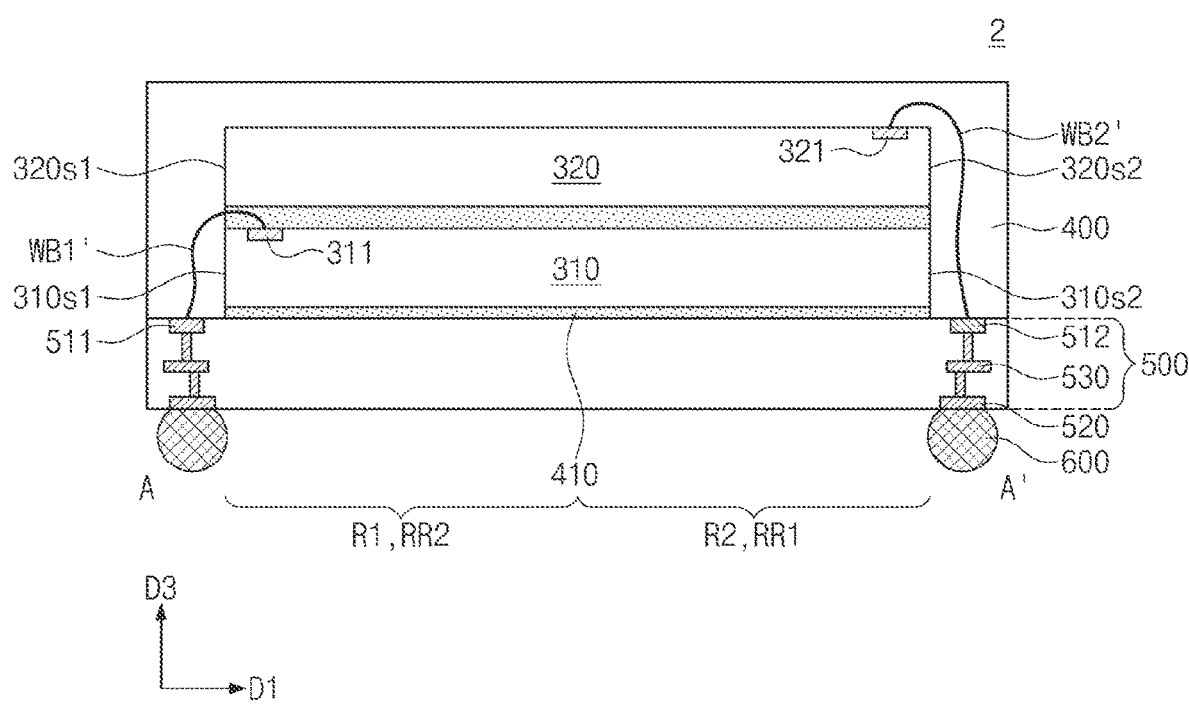
FIG. 4D illustrates a cross-sectional view taken along line A-A' of FIG. 4A.
Figure 4E:
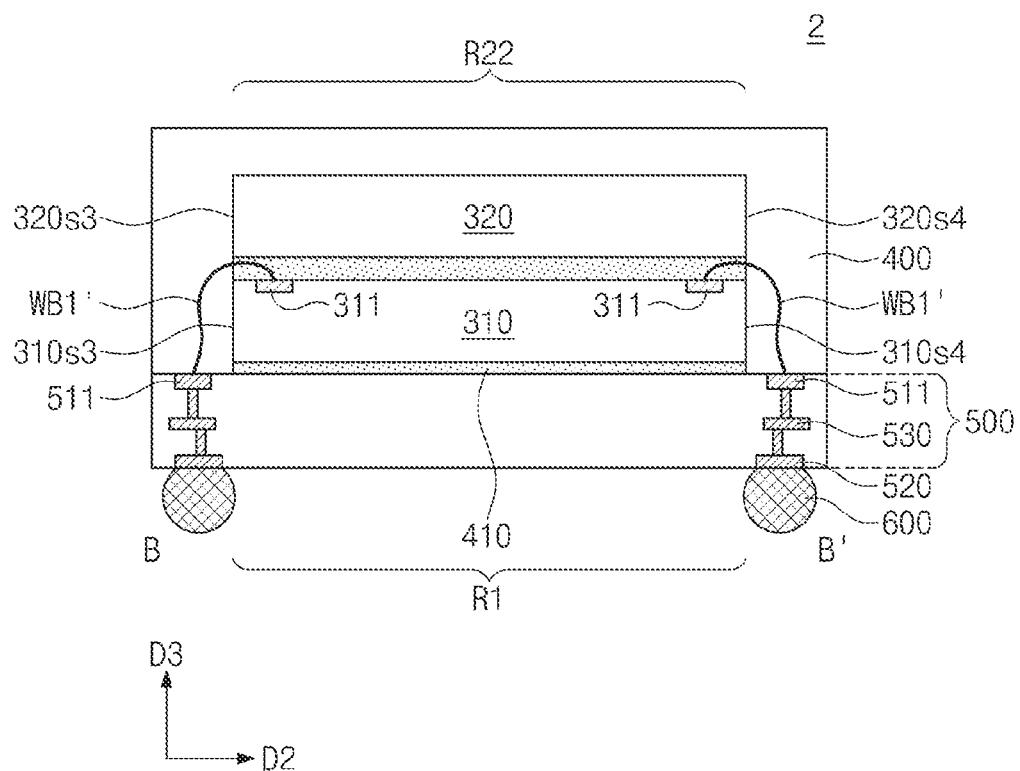
FIG. 4E illustrates a cross-sectional view taken along line B-B' of FIG. 4A.
Figure 4F:
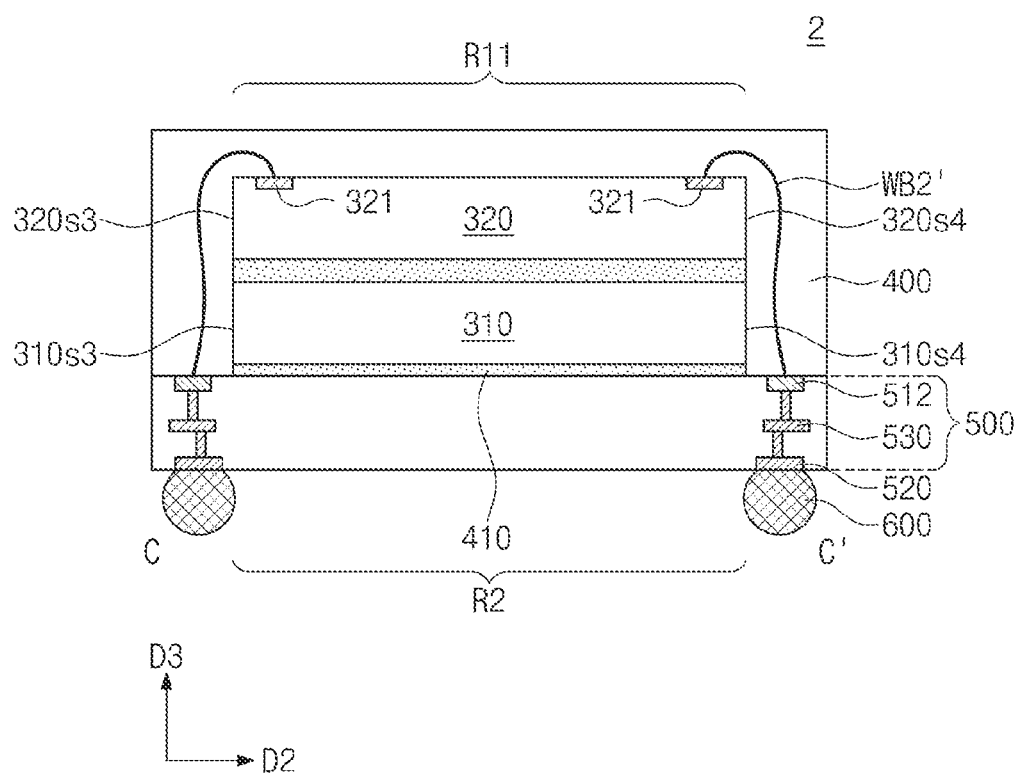
FIG. 4F illustrates a cross-sectional view taken along line C-C' of FIG. 4A.

FIG. 4A illustrates a plan view showing a semiconductor package according to some embodiments. FIG. 4B illustrates a plan view showing a first semiconductor chip according to some embodiments. FIG. 4C illustrates a plan view showing a second semiconductor chip according to some embodiments. FIG. 4D illustrates a cross-sectional view taken along line A-A' of FIG. 4A. FIG. 4E illustrates a cross-sectional view taken along line B-B' of FIG. 4A. FIG. 4F illustrates a cross-sectional view taken along line C-C' of FIG. 4A.

Referring to FIGS. 4A to 4F, a semiconductor package 2 may include a substrate 500, solder balls 600, a first semiconductor chip 310, a second semiconductor chip 320, first bonding wires WB1', second bonding wires WB2', a molding layer 400, and adhesive layers 410. The substrate 500, the solder balls 600, the molding layer 400, and the adhesive layers 410 may be substantially the same as those discussed in the examples of FIGS. 1A to 1E. The substrate 500 may include first substrate pads 511 and second substrate pads 512.

The first semiconductor chip 310 may be disposed on the substrate 500. The first semiconductor chip 310 may be similar to the lower semiconductor chip 100 discussed in the example of FIGS. 1A to 1E. For example, the first semiconductor chip 310 may be a memory chip. For another example, the first semiconductor chip 310 may be a logic chip or a buffer chip.

As illustrated in FIG. 4B, the first semiconductor chip 310 may have a first lateral surface $310s1$, a second lateral surface $310s2$, a third lateral surface $310s3$, and a fourth lateral surface $310s4$. The second lateral surface $310s2$ may stand opposite to the first lateral surface $310s1$ of the first semiconductor chip 310. The third lateral surface $310s3$ may neighbor the first lateral surface $310s1$ of the first semiconductor chip 310. The fourth lateral surface $310s4$ may stand opposite to the third lateral surface $310s3$ of the first semiconductor chip 310. The first and second lateral surfaces $310s1$ and $310s2$ of the first semiconductor chip 310 may be parallel to the first direction D1. The third and fourth lateral surfaces $310s3$ and $310s4$ of the first semiconductor chip 310 may be parallel to the second direction D2.

The first and second lateral surfaces $310s1$ and $310s2$ of the first semiconductor chip 310 may be parallel to a minor-axis direction of the first semiconductor chip 310, and the third and fourth lateral surfaces $310s3$ and $310s4$ of the first semiconductor chip 310 may be parallel to a major-axis direction of the first semiconductor chip 310. The present disclosure, however, is not limited thereto. For example, differently from that shown, the first semiconductor chip 310 may have a square shape when viewed in a plan view.

When viewed in a plan view, the first semiconductor chip 310 may have a first region R1 and a second region R2. When viewed in a plan view, the first region R1 of the first semiconductor chip 310 may be adjacent to the first lateral surface $310s1$ of the first semiconductor chip 310. The second region R2 of the first semiconductor chip 310 may be adjacent to the second lateral surface $310s2$ of the first semiconductor chip 310. The first region R1 of the first semiconductor chip 310 may be provided between a first imaginary center line and the first lateral surface $310s1$. The first imaginary center line may connect a midpoint of the fourth lateral surface $310s4$ to a midpoint of the third lateral surface $310s3$ of the first semiconductor chip 310. The second region R2 of the first semiconductor chip 310 may be provided between the first imaginary center line and the second lateral surface $310s2$. The second region R2 of the first semiconductor chip 310 may have an area substantially the same as that of the first region R1 of the first semiconductor chip 310.

The first semiconductor chip 310 may include first integrated circuits and first chip pads 311. The first integrated circuits may be provided in the first semiconductor chip 310. The first chip pads 311 may be provided on a top surface of the first semiconductor chip 310 and may be electrically connected to the first integrated circuits. The first chip pads 311 may be provided on the first region R1 of the first semiconductor chip 310 and may be spaced apart from the second region R2. The first chip pads 311 may not be provided on the second region R2 of the first semiconductor chip 310. The first region R1 may be a pad region of the first semiconductor chip 310, and the second region R2 may be a blank region of the first semiconductor chip 310.

The first chip pads 311 may include a first group of first chip pads 311, a second group of first chip pads 311, and a third group of first chip pads 311. Some (e.g., the first group of first chip pads 311) of the first chip pads 311 may be disposed adjacent to the third lateral surface 310s3 on the first region R1 of the first semiconductor chip 310 and may be aligned along the second direction D2. Others (e.g., the second group of first chip pads 311) of the first chip pads 311 may be disposed adjacent to the fourth lateral surface 310s4 on the first region R1 of the first semiconductor chip 310 and may be aligned along the second direction D2. The remainder (e.g., the third group of first chip pads 311) of the first chip pads 311 may be disposed adjacent to the first lateral surface 310s1 on the first region R1 of the first semiconductor chip 310 and may be aligned with each other along the first direction D1.

The first chip pads 311 may not be disposed adjacent to the second lateral surface 310s2 of the first semiconductor chip 310. For example, a maximum interval B1 between the first chip pads 311 and the first lateral surface 310s1 of the first semiconductor chip 310 may be less than a minimum interval B2 between the first chip pads 311 and the second lateral surface 310s2 of the first semiconductor chip 310.

As illustrated in FIGS. 4A and 4C, the second semiconductor chip 320 may be disposed on the first semiconductor chip 310. The second semiconductor chip 320 may be a memory chip. For another example, the second semiconductor chip 320 may be a logic chip or a buffer chip.

As illustrated in FIG. 4C, the second semiconductor chip 320 may have a first sidewall 320s1, a second sidewall 320s2, a third sidewall 320s3, and a fourth sidewall 320s4. The second sidewall 320s2 may stand opposite to the first sidewall 320s1 of the second semiconductor chip 320. The third sidewall 320s3 may neighbor the first sidewall 320s1 of the second semiconductor chip 320. The fourth sidewall 320s4 may stand opposite to the third sidewall 320s3 of the second semiconductor chip 320. The first and second sidewalls 320s1 and 320s2 of the second semiconductor chip 320 may be parallel to the first direction D1. The third and fourth sidewalls 320s3 and 320s4 of the second semiconductor chip 320 may be parallel to the second direction D2.

The first sidewalls 320s1 and 320s2 of the second semiconductor chip 320 may be parallel to a minor-axis direction of the second semiconductor chip 320, and the third and fourth sidewalls 320s3 and 320s4 of the second semiconductor chip 320 may be parallel to a major-axis direction of the second semiconductor chip 320. The present disclosure, however, is not limited thereto. For example, the second semiconductor chip 320 may have a square shape when viewed in a plan view.

When viewed in a plan view, the second semiconductor chip 320 may have a first region RR1 and a second region RR2. The first region RR1 of the second semiconductor chip 320 may be adjacent to the first sidewall 320s1 of the second semiconductor chip 320. The first region RR1 of the second semiconductor chip 320 may be provided between a second imaginary center line and the first sidewall 320s1. The second imaginary center line may connect a midpoint of the third sidewall 320s3 to a midpoint of the fourth sidewall 320s4 of the second semiconductor chip 320. The second region RR2 of the second semiconductor chip 320 may be adjacent to the second sidewall 320s2 of the second semiconductor chip 320. The second region RR2 of the second semiconductor chip 320 may be provided between the second imaginary center line and the second sidewall 320s2. The second region RR2 of the second semiconductor chip 320 may have an area substantially the same as that of the first region RR1 of the second semiconductor chip 320.

The second semiconductor chip 320 may include second integrated circuits and second chip pads 321. The second integrated circuits may be provided in the second semiconductor chip 320. The second chip pads 321 may be provided on a top surface of the second semiconductor chip 320 and may be electrically connected to the second integrated circuits. The second chip pads 321 may be provided on the first region RR1 of the second semiconductor chip 320 and may be spaced apart from the second region RR2 of the second semiconductor chip 320. The second chip pads 321 may not be provided on the second region RR2 of the second semiconductor chip 320. The first region RR1 may include a pad region of the second semiconductor chip 320, and the second region RR2 may be a blank region of the second semiconductor chip 320.

The second chip pads 321 may include a first group of second chip pads 321, a second group of second chip pads 321, and a third group of second chip pads 321. Some (e.g., the first group of second chip pads 321) of the second chip pads 321 may be disposed adjacent to the third sidewall 320s3 on the second region RR2 of the second semiconductor chip 320 and may be aligned along the second direction D2. Others (e.g., the second group of second chip pads 321) of the second chip pads 321 may be disposed adjacent to the fourth sidewall 320s4 on the second region RR2 of the second semiconductor chip 320 and may be aligned along the second direction D2. The remainder (e.g., the third group of second chip pads 321) of the second chip pads 321 may be disposed adjacent to the second sidewall 320s2 of the second semiconductor chip 320 and may be aligned with each other along the second direction D2.

The second chip pads 321 may not be adjacent to the first sidewall 320s1 of the second semiconductor chip 320. For example, a maximum interval C1 between the second chip pads 321 and the second sidewall 320s2 of the second semiconductor chip 320 may be less than a minimum interval C2 between the second chip pads 321 and the first sidewall 320s1 of the second semiconductor chip 320.

Differently from that shown, a single second chip pad 321 may be adjacent to the second sidewall 320s2 of the second semiconductor chip 320.

As illustrated in FIGS. 4A, 4D, 4E, and 4F, the second semiconductor chip 320 may have the same size as that of the first semiconductor chip 310. The second semiconductor chip 320 may be of the same type as the first semiconductor chip 310 and may have the same storing capacity as that of the first semiconductor chip 310. For example, the number of the second chip pads 321 may be the same as that of the first chip pads 311. The second chip pads 321 may each have a size substantially the same as that of each of the first chip pads 311. The present disclosure, however, is not limited thereto.

The second semiconductor chip 320 may be stacked on the top surface of the first semiconductor chip 310. The first region RR1 of the second semiconductor chip 320 may overlap the second region R2 of the first semiconductor chip 310 and may be spaced apart from the first region R1 of the first semiconductor chip 310. The second region RR2 of the second semiconductor chip 320 may overlap the first region R1 of the first semiconductor chip 310 and may be spaced apart from the second region R2 of the first semiconductor chip 310. Therefore, when viewed in a plan view, the second chip pads 321 may not overlap the first chip pads 311. When viewed in a plan view, an arrangement of the second chip pads 321 may have 180 degrees rotational symmetry with that of the first chip pads 311.

First bonding wires WB1' may be provided on a top surface at the first region R1 of the first semiconductor chip 310. The first bonding wires WB1' may be coupled to the first substrate pads 511 and the first chip pads 311. The first bonding wires WB1' may be spaced apart from a top surface at the second region R2 of the first semiconductor chip 310.

Second bonding wires WB2' may be provided on a top surface at the first region RR1 of the second semiconductor chip 320. The second bonding wires WB2' may be coupled to the second substrate pads 512 and the second chip pads 321. The second bonding wires WB2' may be spaced apart from a top surface at the second region RR2 of the second semiconductor chip 320. The second bonding wires WB2' may be spaced apart from the first semiconductor chip 310.

The closer the distance between the second bonding wires WB2' and the first bonding wires WB1', the higher the probability of occurrence of an electrical short between the second bonding wires WB2' and the first bonding wires WB1'.

According to some embodiments, as the second chip pads 321 are spaced apart from the first chip pads 311, the second bonding wires WB2' may be spaced apart from the first bonding wires WB1'. An electric short may be prevented between the first bonding wires WB1' and the second bonding wires WB2'. In addition, as the first region RR1 of the second semiconductor chip 320 is spaced apart from the first region R1 of the first semiconductor chip 310, the second bonding wires WB2' may not come in contact with the first bonding wires WB1' even when an error occurs in a process of forming the first bonding wires WB1' and/or the second bonding wires WB2'. Therefore, an electrical short may be effectively prevented between the first bonding wires WB1' and the second bonding wires WB2' and the semiconductor package 2 may greatly increase in reliability and electrical properties.

The first sidewall 320s1, the second sidewall 320s2, the third sidewall 320s3, and the fourth sidewall 320s4 of the second semiconductor chip 320 may be vertically aligned respectively with the first lateral surface 310s1, the second lateral surface 310s2, the third lateral surface 310s3, and the fourth lateral surface 310s4 of the first semiconductor chip 310. As the first region RR1 of the second semiconductor chip 320 is spaced apart from the second region R2 of the first semiconductor chip 310, the second semiconductor chip 320 may not be disposed shifted with respect to the first semiconductor chip 310. Accordingly, the semiconductor package 2 may become small in size.

The adhesive layers 410 may be provided on a bottom surface of the first semiconductor chip 310 and a bottom surface of the second semiconductor chip 320. The adhesive layers 410 may be die attach films. A certain one of the adhesive layers 410 may be interposed between the first semiconductor chip 310 and the second semiconductor chip 320 and may have a relatively large thickness. The certain one adhesive layer 410 may further cover ends of the first bonding wires WB1'.

The molding layer 400 may be provided on a top surface of the substrate 500 and may cover the first semiconductor chip 310 and the second semiconductor chips 320. The molding layer 400 may encapsulate the first and second bonding wires WB1' and WB2'.

Figure 5A:
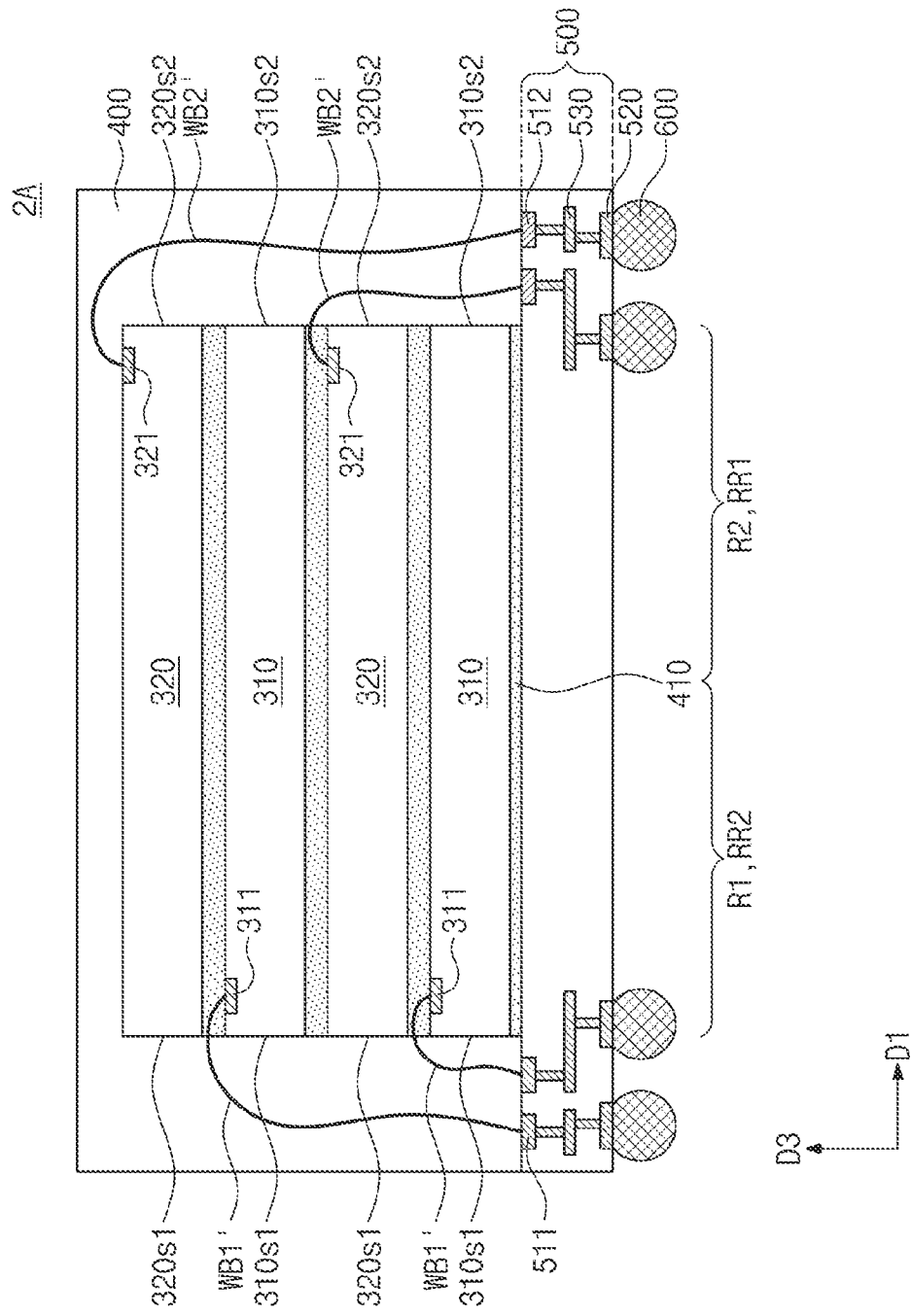
FIGS. 5A, 5B, and 5C illustrate cross-sectional views showing a semiconductor package according to some embodiments.
Figure 5B:
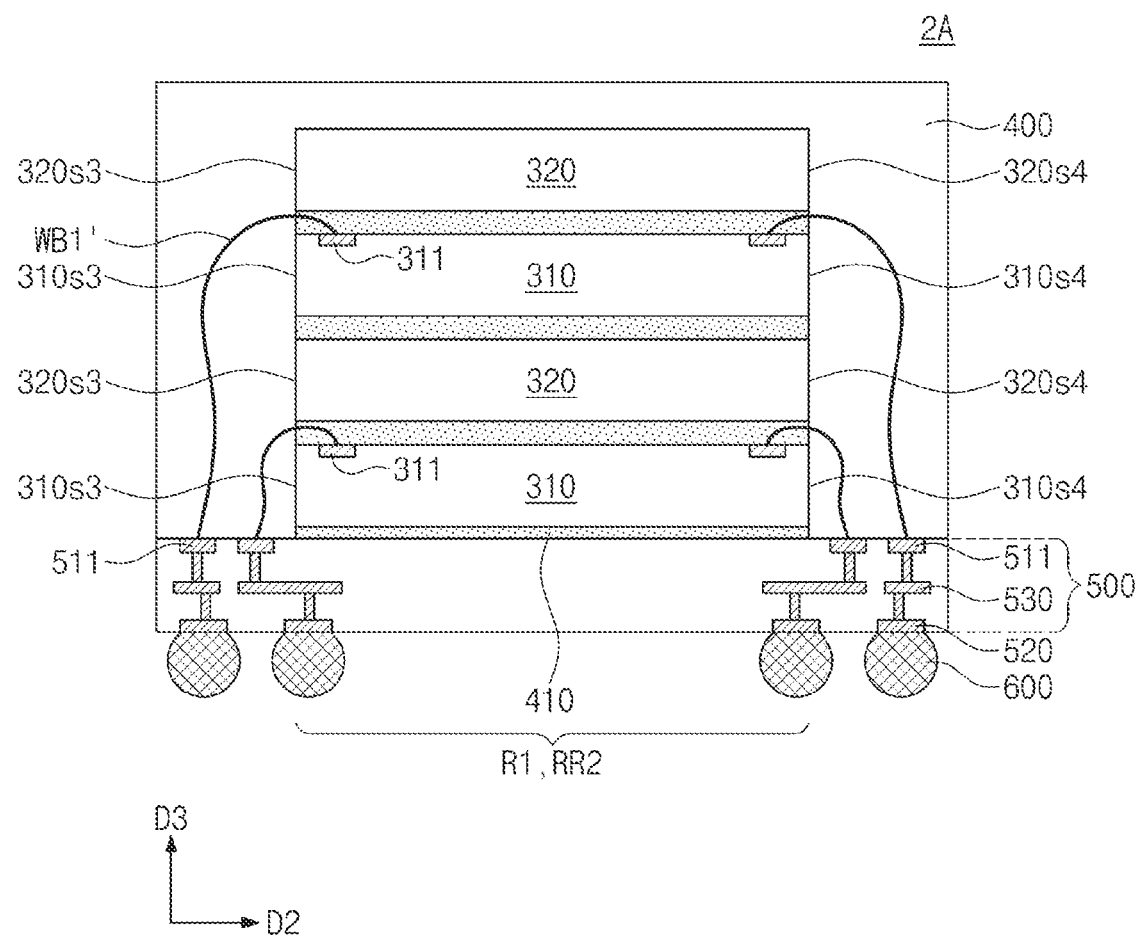
Figure 5C:
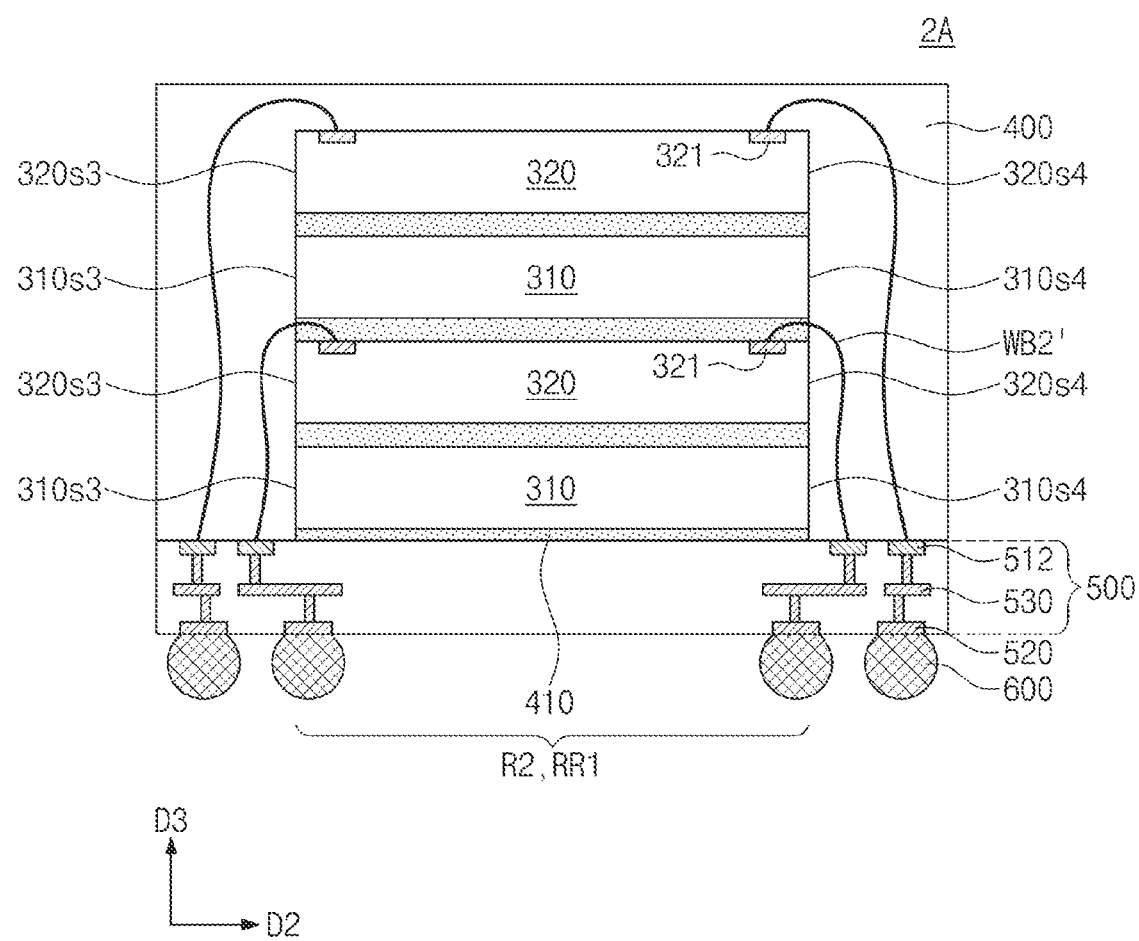

FIGS. 5A, 5B, and 5C illustrate cross-sectional views showing a semiconductor package according to some embodiments. FIGS. 5A, 5B, and 5C correspond to cross-sections respectively taken along lines A-A', B-B', and C-C' of FIG. 4A.

Referring to FIGS. 5A to 5C, a semiconductor package 2A may include a substrate 500, solder balls 600, a plurality of first semiconductor chips 310, a plurality of second semiconductor chips 320, first bonding wires WB1', second bonding wires WB2', a molding layer 400, and adhesive layers 410. The first semiconductor chip 310 and the second semiconductor chip 320 may be substantially the same as those discussed in the examples of FIGS. 4A to 4F. In contrast, the semiconductor package 2A may include a plurality of first semiconductor chips 310 and a plurality of second semiconductor chips 320.

The first semiconductor chips 310 and the second semiconductor chips 320 may be stacked alternately with each other. When viewed in a plan view, the first regions RR1 of the second semiconductor chips 320 may correspondingly overlap the second region R2 of the first semiconductor chips 310 and may be correspondingly spaced apart from the first regions R1 of the first semiconductor chips 310. When viewed in a plan view, the first chip pads 311 of one of the first semiconductor chips 310 may overlap the first chip pads 311 of another of the first semiconductor chips 310. When viewed in a plan view, the first chip pads 311 of the first semiconductor chips 310 may be spaced apart from the second chip pads 321 of the second semiconductor chips 320.

The first sidewall 320s1, the second sidewall 320s2, the third sidewall 320s3, and the fourth sidewall 320s4 of each of the second semiconductor chips 320 may be vertically aligned respectively with the first lateral surface 310s1, the second lateral surface 310s2, the third lateral surface 310s3, and the fourth lateral surface 310s4 of each of the first semiconductor chips 310. The first semiconductor chips 310 may be vertically aligned with each other. The second semiconductor chips 320 may be vertically aligned with each other.

The first bonding wires WB1' may be provided on a top surface at the first region R1 of each of the first semiconductor chips 310. The first bonding wires WB1' may be coupled to the first substrate pads 511 and the first chip pads 311.

The second bonding wires WB2' may be provided on a top surface at the first region RR1 of each of the second semiconductor chips 320. The second bonding wires WB2' may be coupled to the second substrate pads 512 and the second chip pads 321. The second bonding wires WB2' may be spaced apart from the first semiconductor chip 310 and the first bonding wires WB1'.

There may be various changes in the number of the first semiconductor chips 310 and of the second semiconductor chips 320.

According to the present disclosure, semiconductor chips may be stacked. Bonding wires may be disposed on top surfaces of the semiconductor chips. An arrangement of pads of the semiconductor chips may be adjusted to prevent damage to the semiconductor chips in a process of forming the bonding wires. Alternatively, an arrangement of pads of the semiconductor chips may be adjusted to prevent an electrical short between the bonding wires. A semiconductor package may exhibit increased reliability and improved electrical properties. The semiconductor package may increase in fabrication efficiency.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure. An aspect of an embodiment may be achieved through instructions stored within a non-transitory storage medium and executed by a processor.

This detailed description of the present disclosure should not be construed as limited to the embodiments set forth herein, and it is intended that the present disclosure cover the various combinations, the modifications, and the variations of this invention without departing from the spirit and scope of the pre sent disclosure.

What is claimed is:

1. A semiconductor package comprising:
   a substrate;
   a lower semiconductor chip on the substrate;
   a first upper semiconductor chip on a top surface of the lower semiconductor chip and including a plurality of upper pads; and
   a plurality of bonding wires coupled to the substrate and the upper pads, wherein:
   when viewed in a plan view, the first upper semiconductor chip has:
      a first overhang region spaced apart from the lower semiconductor chip and adjacent to a first lateral surface of the first upper semiconductor chip;
      a second overhang region spaced apart from the lower semiconductor chip and adjacent to a second lateral surface of the first upper semiconductor chip; and
      a first corner overhang region spaced apart from the lower semiconductor chip and adjacent to a corner where the first lateral surface of the first upper semiconductor chip meets the second lateral surface of the first upper semiconductor chip,
   the upper pads include:
      a plurality of first upper pads on a top surface of the first overhang region; and
      a plurality of second upper pads on a top surface of the second overhang region,
   the number of the first upper pads is less than the number of the second upper pads, and
   the upper pads are spaced apart from the first corner overhang region of the first upper semiconductor chip.

2. The semiconductor package of claim 1, wherein the number of the second upper pads is about 1% to about 50% of the number of the first upper pads.

3. The semiconductor package of claim 1, wherein:
   the second overhang region of the first upper semiconductor chip includes:
      a blank region adjacent to a third lateral surface of the first upper semiconductor chip; and
      a pad region between the blank region and the first corner overhang region,
   the second upper pads are on the pad region and are spaced apart from the blank region, and
   the third lateral surface of the first upper semiconductor chip is opposite to the first lateral surface of the first upper semiconductor chip.

4. The semiconductor package of claim 3, wherein:
   the pad region of the first upper semiconductor chip is between an imaginary line and the first corner overhang region of the first upper semiconductor chip, and
   the imaginary line passes through a midpoint of the second lateral surface of the first upper semiconductor chip and is parallel to the first lateral surface of the first upper semiconductor chip.

5. The semiconductor package of claim 1, wherein:
   the first overhang region is between a first lateral surface of the lower semiconductor chip and the first lateral surface of the first upper semiconductor chip,
   the second overhang region is between a second lateral surface of the lower semiconductor chip and the second lateral surface of the first upper semiconductor chip, and
   the first corner overhang region is between the first overhang region and the second lateral surface of the first upper semiconductor chip and between the second overhang region and the first lateral surface of the first upper semiconductor chip.

6. The semiconductor package of claim 1, wherein:
   the lower semiconductor chip includes a plurality of lower pads on a top surface of the lower semiconductor chip, and
   the lower pads are exposed by the first upper semiconductor chip.

7. The semiconductor package of claim 6, wherein:
   when viewed in a plan view, the lower semiconductor chip has:
      a first edge region adjacent to a third lateral surface of the lower semiconductor chip;
      a second edge region adjacent to a fourth lateral surface of the lower semiconductor chip; and
      a corner region spaced apart from the first upper semiconductor chip,
   the corner region is adjacent to a corner where the third lateral surface of the lower semiconductor chip meets the fourth lateral surface of the lower semiconductor chip, and
   the lower pads are on the first edge region and the second edge region of the lower semiconductor chip and are spaced apart from the corner region.

8. The semiconductor package of claim 7, wherein:
   the lower pads include:
      a plurality of first lower pads on a top surface of the first edge region; and
      a plurality of second lower pads on a top surface of the second edge region, and
   the number of the second lower pads is less than the number of the first lower pads.

9. The semiconductor package of claim 1, further comprising:
   a second upper semiconductor chip on a top surface of the first upper semiconductor chip, wherein:

when viewed in a plan view, the second upper semiconductor chip has:
- a mounting region that overlaps the first upper semiconductor chip;
- a third overhang region spaced apart from the first upper semiconductor chip and adjacent to a first lateral surface of the second upper semiconductor chip;
- a fourth overhang region spaced apart from the first upper semiconductor chip and adjacent to a second lateral surface of the second upper semiconductor chip; and
- a second corner overhang region spaced apart from the first upper semiconductor chip and adjacent to a corner where the first lateral surface of the second upper semiconductor chip meets the second lateral surface of the second upper semiconductor chip, the second upper semiconductor chip includes a plurality of conductive pads, the conductive pads include:
- a plurality of first conductive pads on a top surface of the third overhang region; and
- a plurality of second conductive pads on a top surface of the fourth overhang region, and the number of the second conductive pads is less than the number of the first conductive pads.

10. The semiconductor package of claim 9, wherein the conductive pads are spaced apart from the second corner overhang region of the second upper semiconductor chip.

11. The semiconductor package of claim 9, wherein:
the number of the first conductive pads is the same as the number of the first upper pads, and
the number of the second conductive pads is the same as the number of the second upper pads.

12. The semiconductor package of claim 9, wherein:
when viewed in a plan view, the first upper semiconductor chip is shifted in one direction from the lower semiconductor chip, and
when viewed in a plan view, the second upper semiconductor chip is shifted in the one direction from the first upper semiconductor chip.

13. The semiconductor package of claim 12, wherein:
when viewed in a plan view, the one direction intersects a first direction and a second direction,
the first direction is parallel to the first lateral surface of the first upper semiconductor chip, and
the second direction is parallel to the second lateral surface of the first upper semiconductor chip.

* * * * *